(12) United States Patent
Suehiro et al.

(10) Patent No.: US 7,560,294 B2
(45) Date of Patent: Jul. 14, 2009

(54) LIGHT EMITTING ELEMENT AND METHOD OF MAKING SAME

(75) Inventors: Yoshinobu Suehiro, Aichi-ken (JP); Naoki Nakajo, Aichi-ken (JP)

(73) Assignee: Toyoda Gosei Co., Ltd., Nishikasugai-gun, Aichi-ken (JP)

(*) Notice: Subject to any disclaimer, the term of this patent is extended or adjusted under 35 U.S.C. 154(b) by 158 days.

(21) Appl. No.: 11/145,167

(22) Filed: Jun. 6, 2005

(65) Prior Publication Data

US 2006/0006408 A1    Jan. 12, 2006

(30) Foreign Application Priority Data

Jun. 7, 2004 (JP) ............................. 2004-168773
Jun. 24, 2004 (JP) ............................. 2004-187097
Sep. 27, 2004 (JP) ............................. 2004-280020
Apr. 28, 2005 (JP) ............................. 2005-133750

(51) Int. Cl.
     *H01L 21/60* (2006.01)

(52) U.S. Cl. ............................. 438/22; 438/29; 438/42; 438/455; 257/E33.005

(58) Field of Classification Search ............... 438/22, 438/29, 42, 455, 46
See application file for complete search history.

(56) References Cited

U.S. PATENT DOCUMENTS

| 6,679,971 | B2 * | 1/2004 | Tone et al. ............... 156/306.6 |
| 6,917,059 | B2 * | 7/2005 | Uemura ..................... 257/103 |
| 2003/0173602 | A1 * | 9/2003 | Hsu et al. ................... 257/290 |

FOREIGN PATENT DOCUMENTS

| JP | 6-291366 | 10/1994 |
| JP | 2003-197961 | 7/2003 |

* cited by examiner

*Primary Examiner*—Michael Trinh
(74) *Attorney, Agent, or Firm*—McGinn IP Law Group, PLLC

(57) ABSTRACT

A light emitting element is provided with a semiconductor layer having a light emitting layer and an uneven surface, and a transparent material formed on the uneven surface. The transparent material has a refractive index lower than a sapphire substrate. Alternatively, a light emitting element is provided with a semiconductor layer including a light emitting layer, and a transparent high-refractive index material layer formed on a light radiation surface of the semiconductor layer. The light emitting element is of a flip-chip type, and the transparent high-refractive index material layer has a refractive index of n=1.6 or more.

5 Claims, 17 Drawing Sheets

10 SAPPHIRE SUBSTRATE

12 AlN BUFFER LAYER
10

15 p-GaN LAYER
14 LIGHT EMITTING LAYER
13 n-GaN LAYER
12
10
100 GaN-BASED SEMICONDUCTOR LAYER 15
14 } 100
13
12
10

15
14 } 100
13
11h GLASS MEMBER 17
15
14 } 100
13
11h n-ELECTRODE 16
18
15
14 } 100
13
11h
LED ELEMENT 1

LIGHT EMITTING ELEMENT AND METHOD OF MAKING SAME

The present application is based on Japanese patent application Nos. 2004-168773, 2004-187097, 2004-280020 and 2005-133750, the entire contents of which are incorporated herein by reference.

BACKGROUND OF THE INVENTION

1. Field of the Invention

This invention relates to a light emitting element (herein also referred to as LED element) and a method of making the same and, particularly, to a light emitting element that allows an enhancement in optical external radiation efficiency while preventing emitted light from being held inside a semiconductor layer with a high optical absorption coefficient, and a method of making the same.

2. Description of the Related Art

Conventionally, a method of making a light emitting element is known in which a semiconductor crystal of group III nitride-based compound semiconductor is grown on a substrate such as sapphire. There is, however, a problem in such a light emitting element that a light emitted in a light-emitting layer thereof is held inside a layer with a high optical absorption coefficient, and part of emitted light is absorbed in the layer, whereby the external radiation efficiency of emitted light lowers.

In order to solve the problem, a light emitting element is suggested in which its sapphire substrate is provided with an uneven surface, and a group III nitride-based compound semiconductor layer is grown thereon (for example, see Paragraph [0011] and FIG. 1 of Japanese Patent Application Laid-Open No. 2003-197961).

In the light emitting element of JP-A No 2003-197961, even when light enters into an interface between the sapphire substrate and the group III nitride-based compound semiconductor layer at a large incident angle (i.e., light that has a small angle defined between the interface and the incidence direction), the light can be externally discharged through a stepped surface (side face) of the uneven buffer layer, so that the light extraction efficiency can be improved.

However, the light emitting element of JP-A No, 2003-197961 involves such problem that, though the sapphire substrate is provided with the uneven surface to extract light (herein called intra-layer confined light) confined inside a layer rather than light directly discharged outside from the group III nitride-based compound semiconductor layer, the light extraction efficiency is not sufficient. Namely, since the light extraction characteristic depends upon the refractive-index difference between the group III nitride-based compound semiconductor layer and the sapphire substrate, the light extraction efficiency is limited Moreover, since the group III nitride-based compound semiconductor layer has a high optical absorption coefficient, the intra-layer confined light must be attenuated so much therein and therefore the optical radiation efficiency cannot be enhanced.

SUMMARY OF THE INVENTION

It is an object of the invention to provide a light emitting element that allows an enhancement in optical external radiation efficiency while preventing emitted light to be held inside a semiconductor layer with a high optical absorption coefficient, and a method of making the same, (1) According to a first aspect of the present invention, a light emitting element comprises:
a semiconductor layer that comprises a light emitting layer and an uneven surface; and
a transparent material formed on the uneven surface;
wherein the transparent material has a refractive index lower than a sapphire substrate.

(2) According to a second aspect of the present invention, a method of making a light emitting element comprises the steps of:
providing an underlying substrate;
forming an uneven surface on the underlying substrate;
forming a semiconductor layer on the uneven surface of the underlying substrate;
lifting off the underlying substrate from the semiconductor layer; and
bonding a transparent material onto the lifted-off surface of the semiconductor layer.

(3) According to a third aspect of the present invention, a method of making a light emitting element comprises the steps of:
providing an underlying substrate;
forming a semiconductor layer on the underlying substrate;
lifting off the underlying substrate from the semiconductor layer;
forming an uneven portion on the lifted-off surface of the semiconductor layer; and
bonding a transparent material onto the uneven portion of the semiconductor layer.

(4) According to a fourth aspect of the present invention, a light emitting element comprises:
a semiconductor layer including a light emitting layer; and
a transparent high-refractive index material layer formed on a light radiation surface of the semiconductor layer,
wherein the light emitting element is of a flip-chip type, and
the transparent high-refractive index material layer has a refractive index of $n=1.6$ or more.

(5) According to a fifth aspect of the present invention, a method of making a light emitting element comprises the steps of:
providing an underlying substrate;
forming a semiconductor layer on the underlying substrate;
lifting off the underlying substrate from the semiconductor layer; and
bonding a transparent high-refractive index material layer onto the lifted-oft surface of the semiconductor layer.

(6) According to a sixth aspect of the present invention, a light emitting element comprises:
a semiconductor layer including a light emitting layer; and
an intermediate refractive index material layer formed on a light radiation surface of the semiconductor layer,
wherein the light emitting element is of a flip-chip type, and
the intermediate refractive index material layer has a refractive index of between the semiconductor layer and a seal material to seal the intermediate refractive index material layer.

BRIEF DESCRIPTION OF THE DRAWINGS

The present invention will be explained in more detail in conjunction with appended drawings, wherein:

FIG. 2A illustrates a step of providing a sapphire substrate, FIG. 2B illustrates a step of providing the sapphire substrate with an uneven surface, FIG. 2C illustrates a step of forming GaN-based semiconductor layers, FIG. 2D illustrates a step of lifting off the sapphire substrate from the GaN-based semiconductor layers, FIG. 2E illustrates a step of providing a glass member to be thermally bonded to the separated GaN-based semiconductor layers, FIG. 2F illustrates a step of thermally bonding the glass member to a n-GaN layer 13, and FIG. 2G illustrates a step of forming electrodes;

FIG. 12A illustrates a step of providing a sapphire substrate, FIG. 12B illustrates a step of forming a buffer layer on the sapphire substrate, FIG. 12C illustrates a step of forming GaN-based semiconductor layers, FIG. 12D illustrates a step of lifting off the sapphire substrate from the GaN-based semiconductor layers, FIG. 12E illustrates a step of providing a glass member to be thermally bonded to the separated GaN-based semiconductor layers, FIG. 12F illustrates a step of thermally bonding the glass member to a n-GaN layer 13, and FIG. 12G illustrates a step of forming electrodes;

DESCRIPTION OF THE PREFERRED EMBODIMENTS

Preferred embodiments of the present invention will be described hereinafter by referring to the accompanying drawings.

First Embodiment (Composition of LED Element 1)

Figure 1:
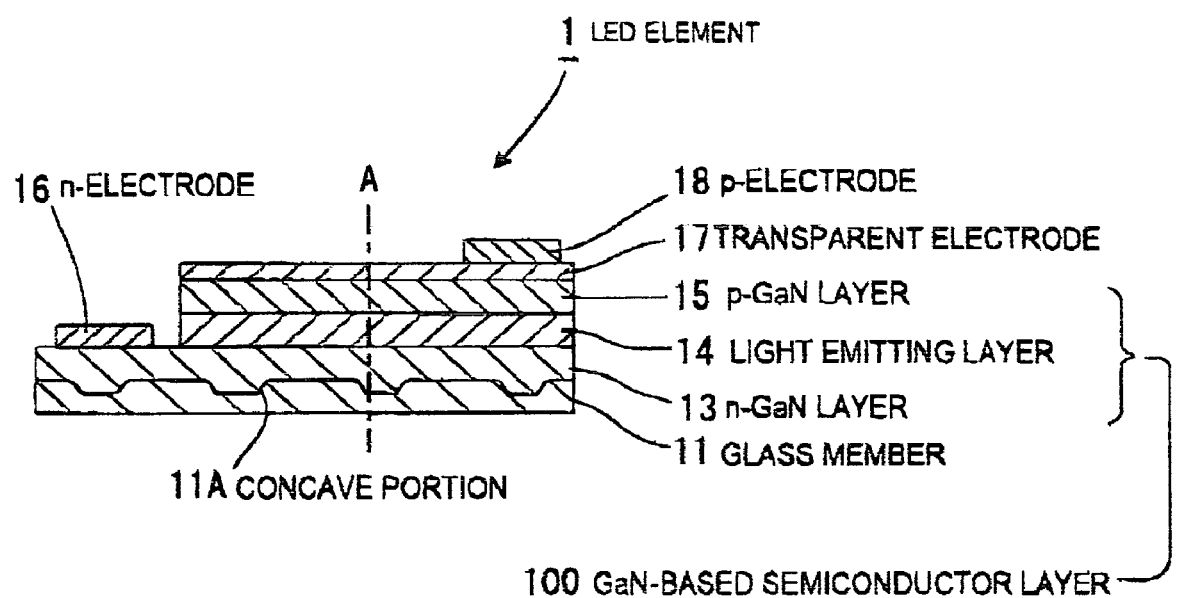
FIG. 1 is a cross sectional view showing an LED element in a first preferred embodiment according to the invention.

FIG. 1 is a cross sectional view showing an LED element in the first preferred embodiment according to the invention.

The face-up type LED element 1 is composed of: a glass member 11 which is made of a transparent material with a lower refractive index than sapphire; an n-GaN layer 13 made of a GaN-based semiconductor compound; a light emitting layer 14 formed on the n-GaN layer 13; a p-GaN layer 15 formed on the light emitting layer 14; an n-electrode 16 formed on the n-GaN layer 13 exposed by partially removing a stack portion from the p-GaN layer 15 up to the n-GaN layer 13 by etching; a transparent electrode 17 formed on the p-GaN layer 15; and a p-electrode 18 formed on the transparent electrode 17.

A method of forming a group III nitride-based compound semiconductor layer (e.g., the GaN-based semiconductor layer 100) is not specifically limited, and well-known metal organic chemical vapor deposition (MOCVD) method, molecular beam epitaxy (MBE) method, hydride vapor phase epitaxy (HVPE) method, sputtering method, ion plating method, cascade shower method and the like are applicable.

The light emitting element may have a homostructure, a heterostructure, or a double heterostructure. Furthermore, a quantum well structure (a single quantum, well structure or a multiquantum well structure) is also applicable.

The glass member 11 has a refractive index of n=1.5, a thermal expansion coefficient of $6 \times 10^{-6}/°C$, and a glass transition point of 540° C. It is thermally bonded to the n-GaN layer 13 exposed on the GaN-based semiconductor layer 100 that is previously grown on a sapphire substrate (not shown) and is then separated from the sapphire substrate by laser beam irradiation.

The glass member 11 is provided with a concave portion 11A to reflect light, which is emitted from the light emitting layer 14 and entered through the n-GaN layer 13 into the glass member 11, in a direction of light extraction from the light emitting layer 14 toward the transparent electrode 17.

The concave portion 11A is formed inverted-trapezoidal, which is provided such that a convex portion previously formed on the n-GaN layer 13 is transferred when the glass member 11 is thermally bonded to the n-GaN layer 13. The convex portion of the n-GaN layer 13 is provided such that an inverted-trapezoidal convex portion is previously formed on the sapphire substrate by etching etc. and then a GaN-based semiconductor layer is formed thereon. The slope of the concave portion 11A is made to be 45 degrees to central axis A of the LED element 1 as shown in FIG. 1.

(Method of Making the Led Element 1)

FIGS. 2A to 2G are cross sectional views showing a method of making the LED element 1. The method of making the LED element 1 will be explained below.

(Step of Providing the Substrate)

Figure 2A:
FIGS. 2A to 2G are cross sectional views showing a method of making the LED element in FIG. 1, where

FIG. 2A illustrates a step of providing the substrate. First, a wafer sapphire substrate 10 is provided as an underlying substrate.

(Step of Forming a Buffer Layer)

Figure 2B:
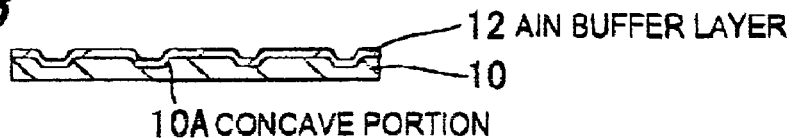

FIG. 2B illustrates a step of forming uneven portions on the sapphire substrate. By etching the sapphire substrate 10, inverted-trapezoidal concave portions 10A are formed at given intervals. Then, an AlN buffer layer 12 is formed on a surface of the sapphire substrate 10 with the concave portions 10A.

(Step of Forming the GaN-based Semiconductor Layer 100)

Figure 2C:
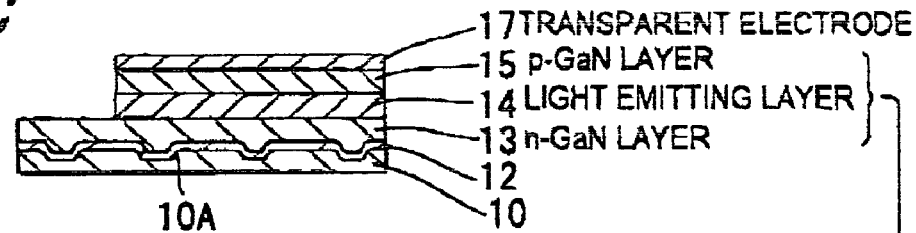

FIG. 2C illustrates a step of forming the GaN-based semiconductor layer 100. The n-GaN layer 13, the light emitting layer 14, and the p-GaN layer 15 are sequentially formed on the AlN buffer layer 12. Then, a stack portion from the p-GaN layer 15 to the n-GaN layer 13 is partially removed by etching to expose the n-GaN layer 13.

(Lift-off Step)

Figure 2D:
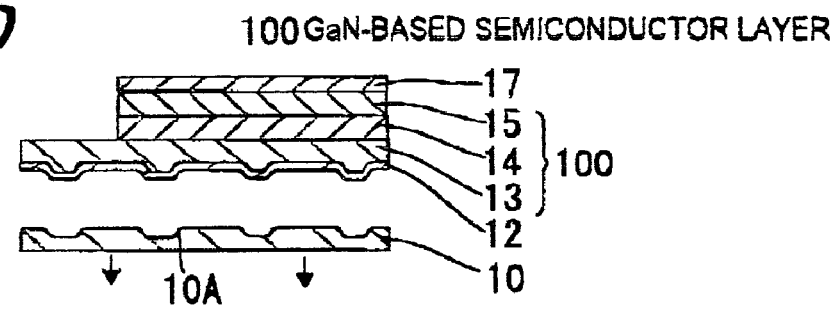

FIG. 2D illustrates a step of lifting off the sapphire substrate 10 from the GaN-based semiconductor layer. A laser beam is irradiated from the side of the sapphire substrate 10 to the entire surface of the wafer in which the GaN-based semiconductor layer 100 as shown in FIG. 2C is stacked on the sapphire substrate 10. In this case, the laser beam irradiated is provided with a wavelength to be transmitted through the sapphire substrate and not to be transmitted through the GaN-based semiconductor layer 100. Due to the irradiation of such a laser beam, the interface between the sapphire substrate 10 and the n-GaN layer 13 is locally heated. As a result, the sapphire substrate 10 as the underlying substrate is removed from the n-GaN layer 13. Further, the AlN buffer layer 12 remained on the surface of the n-GaN layer 13 is removed by acid cleaning.

(Step of Providing the Glass Member 11)

Figure 2E:
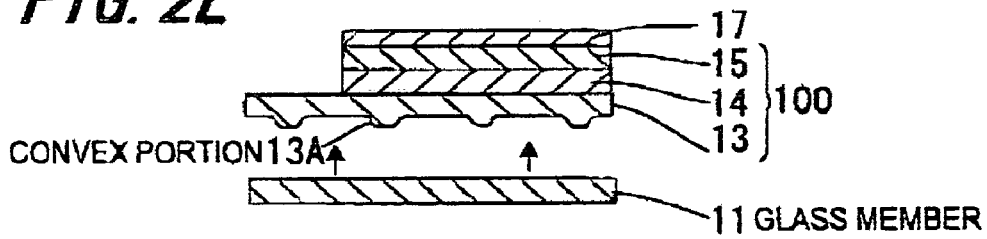

FIG. 2E illustrates a step of providing the glass member 11 to be thermally bonded to the GaN-based semiconductor layer 100 separated from the sapphire substrate. The glass member 11 with a refractive index of n=1.5 is disposed on the side of the n-GaN layer 13 of the GaN-based semiconductor layer 100 that the sapphire substrate 10 is lifted off as shown in FIG. 2D.

(Step of Pressure-bonding the Glass Member 11)

Figure 2F:
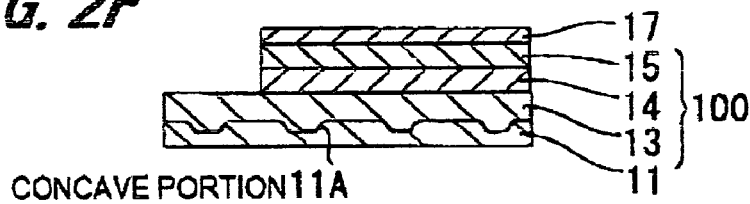

FIG. 2F illustrates a step of pressure-bonding the glass member 11 to the n-GaN layer 13 while thermally melting the glass member 11. The glass member 11 is pressure-bonded to the n-GaN layer 13 by hot-pressing while the concave portion 11A is formed thereon by transferring the convex portion formed on the n-GaN layer 13.

(Step of Forming Electrodes)

Figure 2G:
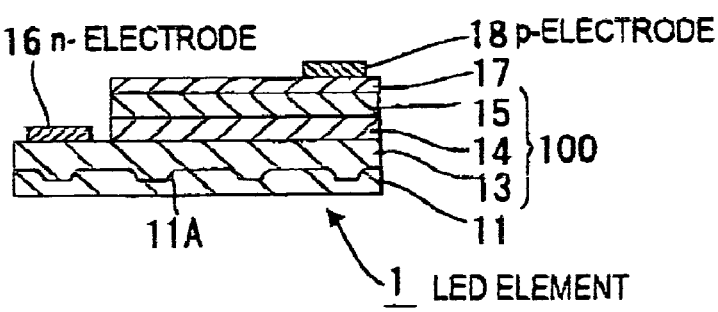

FIG. 2G illustrates a step of forming electrodes. The n-electrode 16 is formed on the n-GaN layer 13 exposed by etching, and the p-electrode 18 is formed on the transparent electrode 17. After forming the electrodes, the resulting wafer is cut by a dicer into the individual LED elements 1, and an insulation film (not shown) is formed on a surface of the LED element 1 except for the electrodes. In this case, the wafer may be cut by another manner other than the dicer, for example, scribing is also applicable.

In fabricating an LED lamp by using the LED element 1 thus formed, the LED element 1 is mounted on a lead made of copper alloy and then the n-electrode 16 and the p-electrode 18 are bonded through an Au wire to the lead. Then, the LED element 1 is sealed with a seal resin to be integrated into a package (Operation of the Led Element 1)

When the lead of the LED lamp is connected to a power supply (not shown) and a forward voltage is applied form the lead through the Au wire to the n-electrode 16 and the p-electrode 18, a carrier recombination of a hole and an electron is generated in the light emitting layer 14 to emit a light.

Of blue light emitted, a light component radiated from the light emitting layer 14 toward the transparent electrode 17 enters into the seal resin through the transparent electrode 17, and it is externally radiated from the seal resin.

Further, of blue light emitted, a light component radiated from the light emitting layer 14 toward the n-GaN layer 13 and not falling within a critical angle of the glass member 11 is reflected on an interface between the n-GaN layer 13 and the glass member 11. Then it is forwarded to the transparent electrode 17 and is externally radiated from the LED element 1.

A part of the intra-layer confined light laterally (in the side direction of layer) propagated inside the n-GaN layer 13 enters into the concave portion 11A formed on the glass member 11, and it is reflected on the interface of the n-GaN layer 13 and the glass member 1. Then it is forwarded to the transparent electrode 17 and is externally radiated from the LED element 1.

Advantages of the First Embodiment

In the first embodiment, the following advantages can be obtained.

(1) The sapphire substrate 10 is lifted off from the n-GaN layer 13 of the LED element 1, and the glass member 11 with a lower refractive index than the sapphire substrate 10 is bonded to the n-GaN layer 13. Hence, the intra-layer confined light held inside the GaN layer can be efficiently reflected by the concave portion 11A and forwarded to the transparent electrode 17. As a result, the light extraction efficiency can be enhanced.

When the sapphire substrate 10 is used, the critical angle θc based on the ratio in refractive index between the sapphire substrate 10 and the n-GaN layer 13 is 1.7 (sapphire)/2.4 (GaN): θc=45 degrees. In contrast, when the glass member 11 with a refractive index of n=1.5 is used, the critical angle θc based on the ratio in refractive index between the glass member 11 and the n-GaN layer 13 is 1.5 (glass)/2.4 (GaN): θc=39 degrees. As a result, blue light to be transmitted through the glass member 11 decreases, and blue light to be reflected on the interface between the n-GaN layer 13 and the glass member 11 increases. Therefore, the external radiation can be promoted without confining blue light inside the layer with the high optical absorption coefficient.

(2) The transparent glass member 11 is bonded to the n-GaN layer 13 from which the sapphire substrate 10 is previously lifted off by laser beam. Thus, the LED element 1 can be easily fabricated according to an emission wavelength or desired light extraction efficiency.

(3) The Glass material, which is transparent material and can be thermally transformed, is pressure-bonded by hot-pressing. Thus, since it has an excellent adhesiveness to the n-GaN layer 13, the bonding process can be easily performed.

Although, in the first embodiment, the concave portion 10A is formed on the sapphire substrate 10 and the GaN-based semiconductor layer 100 is formed thereon, other process may be used to form the uneven surface (i.e., the concave portion 11A) on the glass member 11. For example, the GaN-based semiconductor layer 100 may be formed without forming the concave portion on the sapphire substrate 10, and then the sapphire substrate 10 may be lifted off, and then an uneven surface may be formed on the exposed surface of the n-GaN layer 13 by etching Second Embodiment (Composition of LED element 1)

Figure 3:
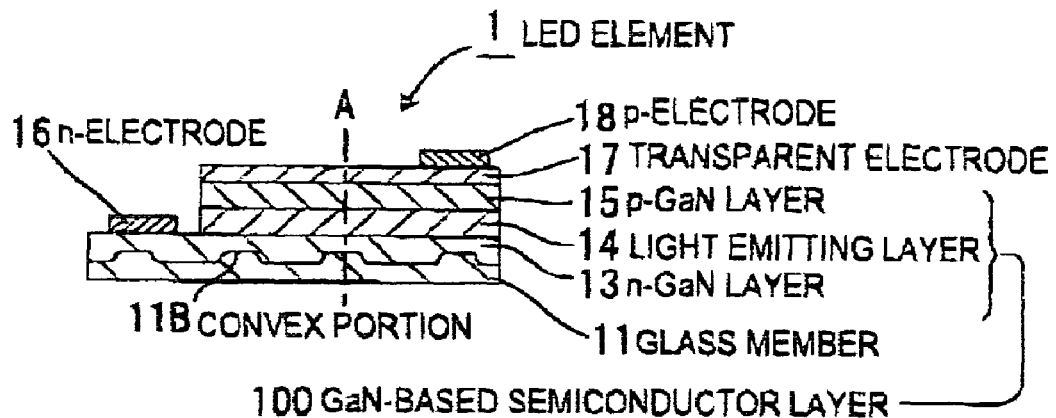
FIG. 3 is a cross sectional view showing an LED element in a second preferred embodiment according to the invention.

FIG. 3 is a cross sectional view showing an LED element in the second preferred embodiment according to the invention. Hereinafter, like components are indicated by the same numerals as used in the first embodiment.

The face-up type LED element 1 of the second embodiment is different from the first embodiment in that, instead of the concave portion 11A of the glass member 11 in the first embodiment, convex portions 11B protruding toward the n-GaN layer 13 are formed a, given intervals on the glass member 11.

Advantages of the Second Embodiment

In the second embodiment, in addition to the advantages of the first embodiment, the intra-layer confined light propagated inside the n-GaN layer 13 can easier reach the convex portion 11B protruding toward the n-GaN layer 13. Thereby, light reflected on the convex portion 11B can be further increased, and therefore it can be further forwarded to the transparent electrode 17. As a result, the light extraction efficiency can be enhanced.

As is the case with the first embodiment, in the second embodiment, the GaN-based semiconductor layer 100 may be formed without forming the concave portion on the sapphire substrate 10, and then the sapphire substrate 10 may be lifted off, and then an uneven surface may be formed on the exposed surface of the n-GaN layer 13 by etching.

Third Embodiment (Composition of LED Element 1)

Figure 4:
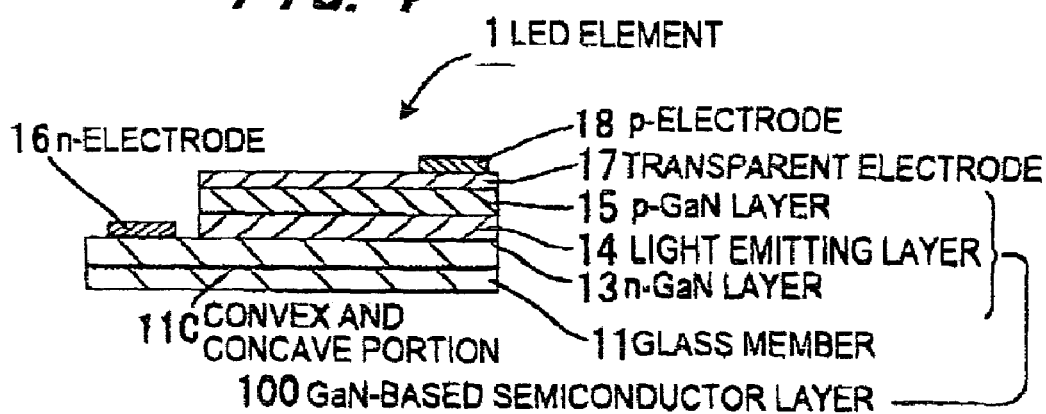
FIG. 4 is a cross sectional view showing an LED element in a third preferred embodiment according to the invention.

FIG. 4 is a cross sectional view showing an LED element in the third preferred embodiment according to the invention.

The face-up type LED element 1 of the third embodiment is different from the first embodiment in that microscopic convex and concave portions 11C are formed at the interface between the glass member 11 and the n-GaN layer 13 in the first embodiment.

The convex and concave portions 11C of the glass member 11 are irregularly and finely formed by roughening, etching etc. of the surface of the sapphire substrate 10.

Advantages of the Third Embodiment

In the third embodiment, the shape of the convex and concave portions need not be controlled as in the first embodiment. Since the amount of the intra-layer confined light inside the GaN layer is much, the intra-layer confined light can be efficiently reflected on the convex and concave portions 11C formed at the interface between the glass member 11 and the n-GaN layer 13. As a result, the light extraction efficiency can be enhanced.

As is the case with the first embodiment, in the third embodiment, the GaN-based semiconductor layer 100 may be formed without forming the concave portion on the sapphire substrate 10, and then the sapphire substrate 10 may be lifted off, and then a microscopic uneven surface may be formed on the exposed surface of the n-GaN layer 13 by etching.

Fourth Embodiment (Composition of LED Element 1)

Figure 5:
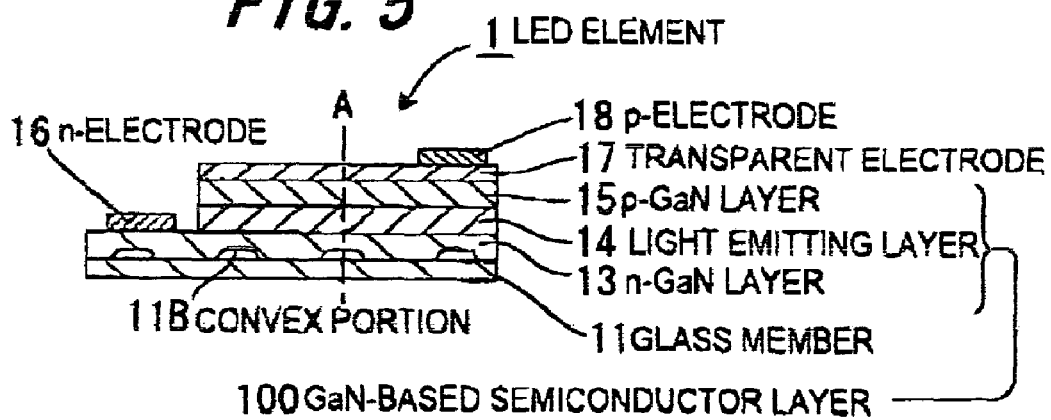
FIG. 5 is a cross sectional view showing an LED element in a fourth preferred embodiment according to the invention.

FIG. 5 is a cross sectional view showing an LED element in the fourth preferred embodiment according to the invention.

The face-up type LED element 1 of the fourth embodiment is different from the second embodiment in that, when the flat glass member 11 is thermally bonded to the n-GaN layer 13 as explained in the second embodiment, concave (and hollow) portions 13B defined as a tapered air layer are at given intervals between the glass member 11 and the n-GaN layer 13.

The concave portion 13B is formed on the n-GaN layer 13 corresponding to a convex portion that is previously formed by etching etc. on the sapphire substrate 10 as the underlying substrate for providing the GaN-based semiconductor layer 100. It is exposed at the bottom of the n-GaN layer 13 when the sapphire substrate 10 is lifted off from the n-GaN layer 13.

The glass member 11 is thermally bonded to the n-GaN layer 13 so as not to fill the concave portion 13B formed on the n-GaN layer 13.

FIGS. 6A to 6E are diagrams illustrating the behavior of blue emitted light propagated inside the n-GaN layer.

Figure 6A:
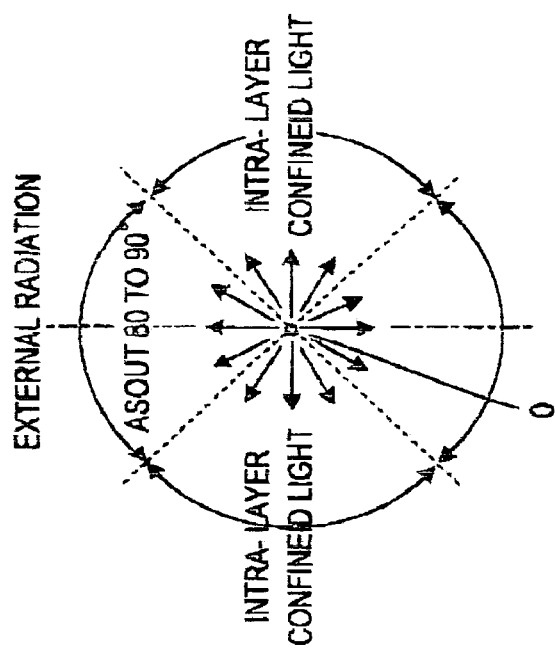
FIGS. 6A to 6E are diagrams illustrating the behavior of blue emitted light propagated inside the n-GaN layer.

As shown in FIG. 6A, an air layer 13C with an refractive index of n=1.0 is defined inside the concave portion 13B formed between the glass member 11 and the n-GaN layer 13. Due to the air layer 13C, blue light propagated inside the n-GaN layer 13 and irradiated to a slope 130 of the concave portion 13B behaves as follows.

(Behavior of Blue Light L1)

Blue light irradiated from a direction of obliquely downward relative to horizontal toward the slope 130 of the concave portion 13B is totally reflected at the interface of the n-GaN layer 13 and the air layer 13C. Thereby, it is forwarded in the light extraction direction of the LED element 1 where the transparent electrode 17 is located.

(Behavior of Blue Light L2)

Blue light irradiated from a direction of nearly horizontal toward the slope 130 of the concave portion 13B is also totally reflected at the interface of the n-GaN layer 13 and the air layer 13C. Thereby, it is forwarded in the light extraction direction of the LED element 1 where the transparent electrode 17 is located.

(Behavior of Blue Light L3)

Blue light irradiated from a direction of obliquely upward relative to horizontal toward the slope 130 of the concave portion 13B is also totally reflected at the interface of the n-GaN layer 13 and the air layer 13C. Thereby, it is forwarded in the light extraction direction of the LED element 1 where the transparent electrode 17 is located.

(Behavior of Blue Light L4)

Blue light irradiated from a direction of perpendicular to the slope 130 of the concave portion 13B is entered into the air layer 13C without being refracted and then refracted downward inside the glass member 11. Thus, it can be easy extracted from the LED element 1.

Figure 6B:
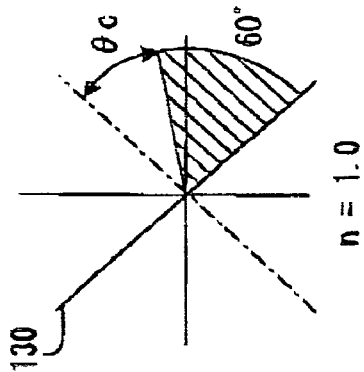

FIG. 6B illustrates the radiation characteristics of light generated at a point O in the light emitting layer 14.

Blue light generated at the point O in the light emitting layer 14 is radiated in all directions. Of the radiated light, light radiated toward the seal material (n=1.5) of the LED element 1 or toward the sapphire substrate 10 (n=1.7) falls within about 40 to 45 degrees from the central axis of the LED element 1. Light radiated in the other directions becomes intra-layer confined light propagated inside the GaN layer. The solid angle in directions corresponding to the intra-layer confined light is 70% or more of the total.

Figure 6C:
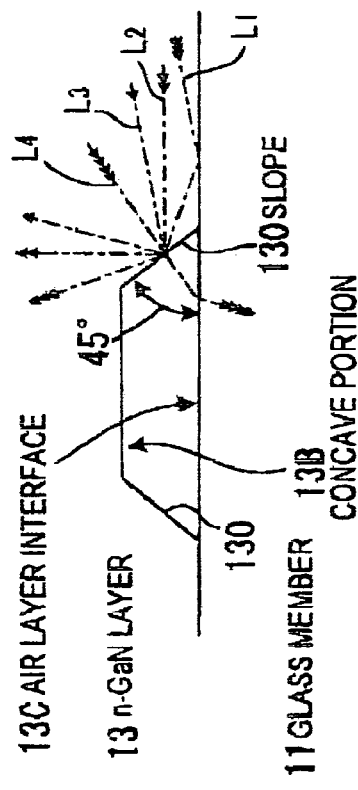

FIG. 6C illustrates a critical angle defined when the sapphire substrate 10 (net=1.7) is provided in place of the air layer 13C in the structure as shown in FIG. 6A The critical angle θ c to the slope 130 of the concave portion 138 is 1.7/2.4: θ c=45 degrees. Therefore, of the intra-layer confined light being not externally radiated from the n-GaN layer 13, blue light irradiated within a hatched angle (i.e., 45 degrees=90 degrees−θ c) as shown in FIG. 6C can be totally reflected at the interface. From the viewpoint of the solid angle, blue light can be externally radiated in an angular direction of 36% of the total or 50% of the intra-layer confined light.

Figure 6D:
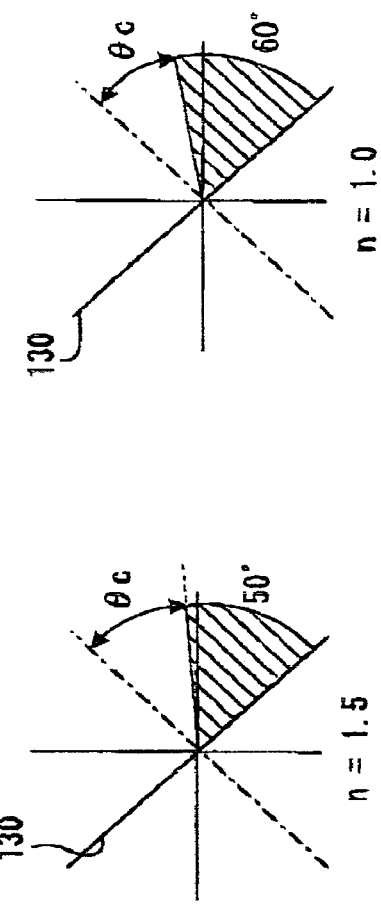

FIG. 6D illustrates a critical angle defined when the glass member 11 (n=1.5) is provided in place of the air layer 13C in the structure as shown in FIG. 6A. The critical angle θ c to the slope 130 of the concave portion 13B is 1.5/2.4: θ c=40 degrees. From the viewpoint of the solid angle, blue light can be externally radiated in an angular direction of 43% of the total or 60% of the intra-layer confined light.

Figure 6E:
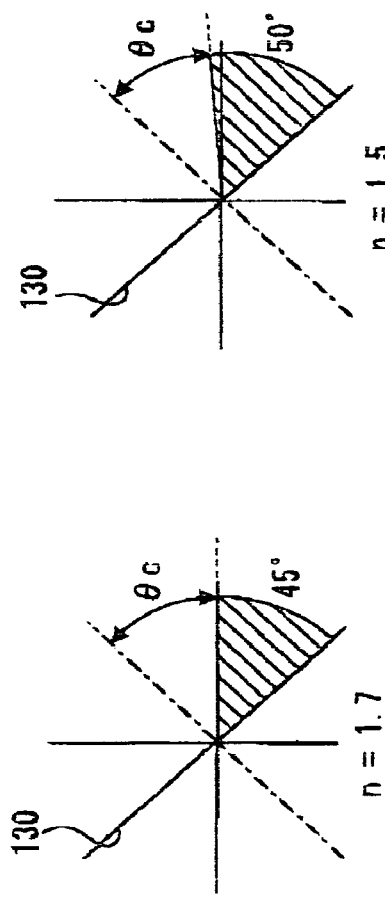

FIG. 6E illustrates a critical angle defined when the air layer 13C is provided in the structure as shown in FIG. 6A. The critical angle θ c to the slope 130 of the concave portion 13B is 1.0/2.4: θ c=24.6 degrees. From the viewpoint of the solid angle, blue light can be externally radiated in an angular direction of 56% of the total or 79% of the intra-layer confined light.

Advantages of the Fourth Embodiment

In the fourth embodiment, the concave portion 13B is formed between the glass member 11 and the n-GaN layer 13, and the air layer 13C is defined inside the concave portion 13B. Thereby, most of blue light irradiated to the slope 130 of the concave portion 13B can be totally reflected at the interface and forwarded to the transparent electrode 17.

Further, blue light (i.e., transmitted light) irradiated within the critical angle and entered into the glass member 11 is subjected to a chance in radiation direction (i.e., refracted downward as shown by light L4 in FIG. 6A) due to the air layer 13C. Then, it is reflected at the bottom of the glass member 11 and then forwarded to the transparent electrode 17. Thus, the transmitted light can be efficiently extracted from the GaN-based semiconductor layer 100 as well as the totally reflected light.

Fifth Embodiment (Composition of LED Element 1)

Figure 7:
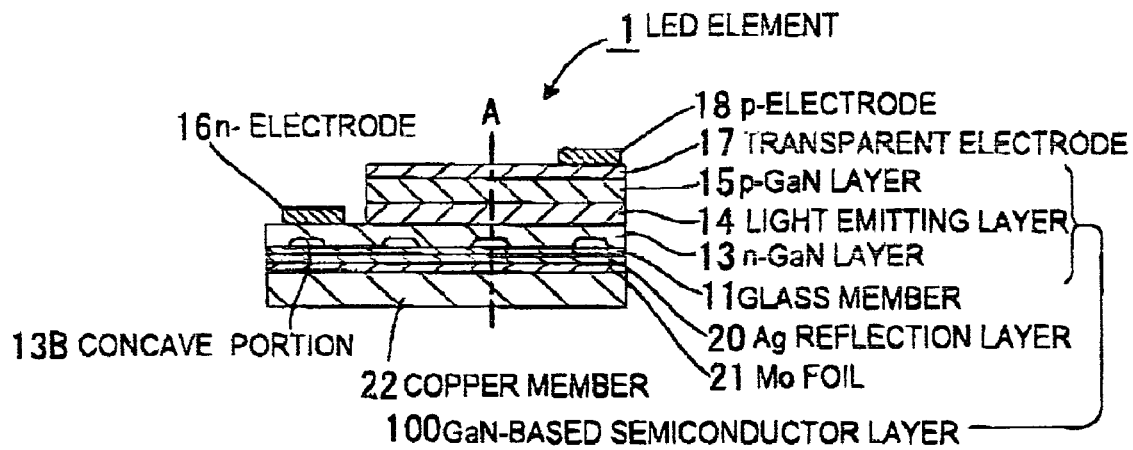
FIG. 7 is a cross sectional view showing an LED element in a fifth preferred embodiment according to the invention.

FIG. 7 is a cross sectional view showing an LED element in the fifth preferred embodiment according to the invention.

The face-up type LED element 1 of the fifth embodiment is different from the second embodiment in that the glass member 11 of the fourth embodiment is low-profiled and thermally bonded to the n-GaN layer 13 with the concave portion 13B, and, under the glass member 11, there are sequentially provided an Ag reflection layer 20 with a high reflectivity, a Mo foil 21, and a copper member 22 for heat radiation, where the Mo foil 21 functions to relax a difference in thermal expansion between the Ag reflection layer 20 and the copper member 22.

The Ag reflection layer 20 is formed by depositing a thin film of Ag by using the deposition method.

Advantages of the Fifth Embodiment

In the fifth embodiment, since the Ag reflection layer 20 is provided through the low-profiled glass member 11 under the n-GaN layer 13 (i.e., the Ag reflection layer 20 is not directly in contact with the n-GaN layer 13), the intra-layer confined light inside the n-GaN layer 13 is not directly entered into the Ag reflection layer 20. Thus, the light extraction efficiency toward the transparent electrode 17 can be enhanced while preventing an absorption loss.

In other words, if the Ag reflection layer 20 is directly in contact with the n-GaN layer 13, the intra-layer confined light repeats the infra-layer reflection many times inside the thin GaN layer while being reflected on the Ag reflection layer 20. Therefore, the intra-layer confined light may cause a large absorption loss. In contrast, in case of having the glass member 11, since light entered into the glass member 11 is subjected to a change in radiation direction (i.e., refracted downward as shown by light L4 in FIG. 6A), the intra-layer reflection inside the n-GaN layer 13 can be reduced. Therefore, the absorption loss can be prevented by that much.

Further, since the glass member 11 is low-profiled, the heat radiation toward the copper member 22 can be promoted.

Sixth Embodiment (Composition of LED Element 1)

Figure 8:
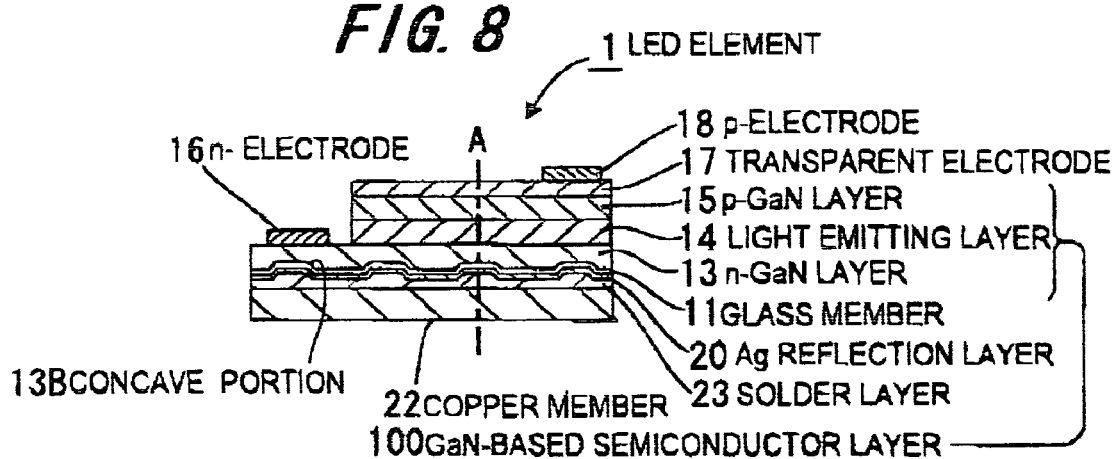
FIG. 8 is a cross sectional view showing an LED element in a sixth preferred embodiment according to the invention.

FIG. 8 is a cross sectional view showing an LED element in the sixth preferred embodiment according to the invention.

The face-up type LED element 1 of the sixth embodiment is different from the fifth embodiment in that the glass member 11 and the Ag reflection layer 20 of the fifth embodiment are disposed inside the concave portion 13B of the n-GaN layer 13, and a solder layer 23 is disposed between the Ag reflection layer 20 and the copper member 23.

Advantages of the Sixth Embodiment

In the sixth embodiment, since the Ag reflection layer 20 is provided inside the concave portion 13B of the n-GaN layer 13, the intra-layer confined light entered into the concave portion 13B is reflected on the Ag reflection layer 20. Thereby, the intra-layer confined light can be efficiently forwarded to the transparent electrode 17. As a result, the light extraction efficiency of the intra-layer confined light can be enhanced.

Figure 9:
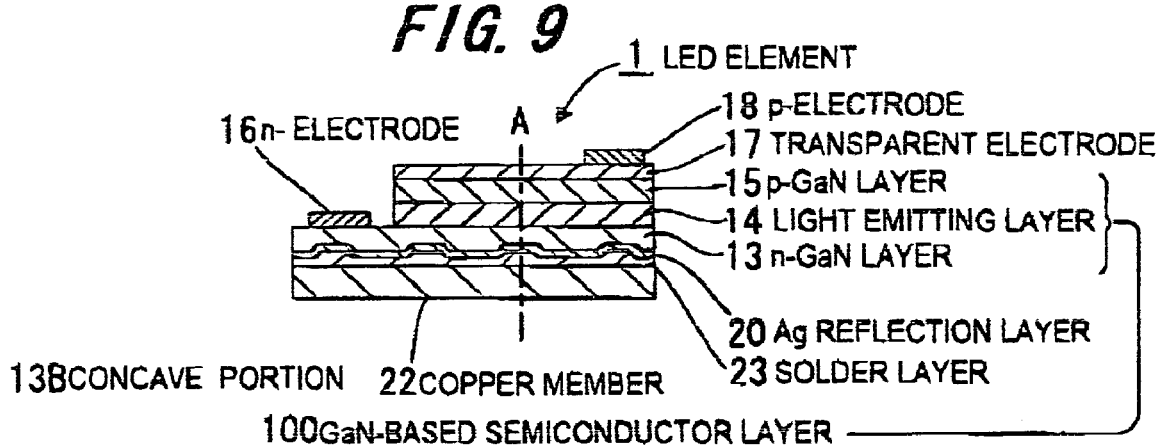
FIG. 9 is a cross sectional view showing a modification in the LED element of the sixth preferred embodiment according to the invention.

FIG. 9 is a cross sectional view showing a modification in the LED element of the sixth preferred embodiment according to the invention.

In the modification, the Ag reflection layer 20 is directly bonded to the n-GaN layer 13. Even when the glass member 11 is not provided therebetween, the intra-layer confined light can be efficiently extracted toward the transparent electrode 17.

Due to not having the glass member 11, the number of steps in manufacturing process can be reduced to lower the manufacturing cost, and the entire LED element 1 can be low-profiled Seventh Embodiment (Composition of LED Element 1)

Figure 10A:
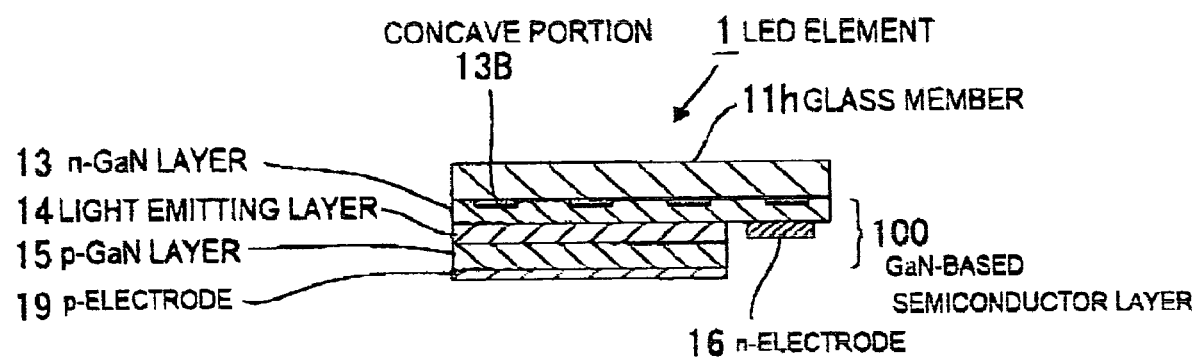
FIG. 10A is a cross sectional view showing a flip-chip type LED element in a seventh embodiment according to the invention.
Figure 10B:
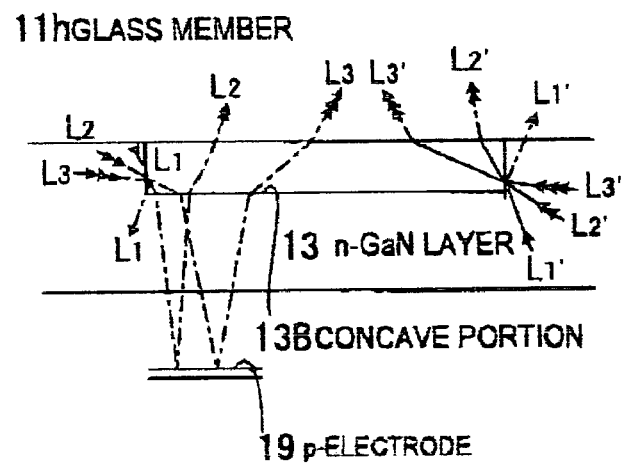
FIG. 10B is a diagram illustrating the behavior of blue emitted light inside the n-GaN layer.

FIG. 10A is a cross sectional view showing a flip-chip type LED element in the seventh embodiment according to the invention. FIG. 10B is a diagram illustrating the behavior of blue emitted light inside the n-GaN layer.

The flip-chip type LED element 1 of the seventh embodiment is composed of: a glass member 11$h$ which is a transparent and high refractive-index material with a higher refractive index than sapphire; an n-GaN layer 13 made of a GaN-based semiconductor compound; a light emitting layer 14 formed on the n-GaN layer 13; a p-GaN layer 15 formed on the light emitting layer 14; an n-electrode 16 formed on the n-GaN layer 13 exposed by partially removing a stack portion from the p-GaN layer 15 up to the n-GaN layer 13 by etching; and a p-electrode 19 formed on the p-GaN layer 15.

The GaN-based semiconductor layer 100 is previously grown on a sapphire substrate (not shown) as an underlying substrate only forming the GaN-based semiconductor layer 100. In the growth, a concave portion 13B (in cylindrical column form) is formed on the n-GaN layer 13 corresponding to a convex portion formed on the sapphire substrate. The concave portion 13B can be patterned in lattice or zigzag form etc.

In fabricating the LED element 1, the sapphire substrate is lifted off from the n-GaN layer 13 by the laser beam irradiation toward the sapphire substrate, and then the glass member 11$h$ is thermally bonded to the n-GaN layer 13. An air layer is defined inside the concave portion 13B formed between the glass member 11 and the n-GaN layer 13. The fabrication process is conducted in wafer state. Then, the electrodes 16 and 19 are formed and the wafer is cut by dicing.

The n-GaN layer 13 includes, as shown in FIG. 10B, the air layer that has a refractive index of n=1.0 and is defined inside the concave portion 13B formed between the glass member 11 and the n-GaN layer 13. Due to the air layer, blue light propagated inside the n-GaN layer 13 behaves as follows.

(Behavior of Blue Light L1, L1')

Blue light L1 irradiated from upward to the side face of the concave portion 13B at an angle greater than the critical angle is totally reflected at the interface of the n-GaN layer 13 and the air layer. Then, the reflected blue light L1 is again reflected upward on the p-electrode 19, and it is externally radiated through the glass member 11$h$.

Also, blue light L1' irradiated from downward to the side face of the concave portion 13B at an angle greater than the critical angle is totally reflected at the interface of the n-GaN layer 13 and the air layer. Then, it is externally radiated through the glass member 11$h$. Since the side face of the concave portion 13B is nearly vertical, when blue light forwarded from the n-GaN layer 13 to the glass member 11$h$ at an angle (i.e., an angle greater than the critical angle) not to be totally reflected at the interface therebetween is irradiated to the side face of the concave portion 13B, it can be transmitted into the glass member 11$h$ after being totally reflected at the side face of the concave portion 13B.

(Behavior of Blue Light L2, L2')

Blue light L2 irradiated from a direction of obliquely upward toward the side face of the concave portion 13B is transmitted through the interface of the n-GaN layer 13 and the air layer and is refracted at the interface of the air layer and the n-GaN layer 13. Thus, as shown in FIG. 10B, light L2 is vertically downward forwarded to the p-electrode 19, reflected upward on the p-electrode 19, transmitted through the n-GaN layer 13, refracted again at the interface of the n-GaN layer 13 and the air layer, entered into the glass member 11$h$, and externally radiated from the glass member 11$h$.

Blue light L2' irradiated from a direction of obliquely downward toward the side face of the concave portion 13B is refracted upward at the interface of the n-GaN layer 13 and the air layers entered into the glass member 11$h$ while being further upward refracted at the interface of the air layer and the glass member 11$h$, and externally radiated from the glass member 11$h$.

(Behavior of Blue Light L3, L3')

Blue light L3 irradiated from a direction of nearly horizontal toward the side face of the concave portion 13B is transmitted through the interface of the n-GaN layer 13 and the air layer and is refracted at the interface of the air layer and the n-GaN layer 13. Thus, as shown in FIG. 10B, light L3 is vertically downward forwarded to the p-electrode 19, reflected upward on the p-electrode 19, transmitted through the n-GaN layer 13, refracted again at the interface of the n-GaN layer 13 and the air layer, entered into the glass member 11$h$, and externally radiated from the glass member 11$h$.

Blue light L3' irradiated from a direction of nearly horizontal toward the side face of the concave portion 13B is refracted upward at the interface of the n-GaN layer 13 and the air layer, entered into the glass member 11$h$ while being further upward refracted at the interface of the air layer and the glass member 11$h$, and externally radiated from the glass member 11$h$.

Advantages of the Seventh Embodiment

In the seventh embodiment, since blue light irradiated toward the side face of the concave portion 13B of the n-GaN layer 13 is vertically refracted in a direction of the glass member 11$h$ or the p-electrode 19, the flip-chip type LED element 1 can have an enhanced light extraction efficiency.

Thus, the LED element 1 of the seventh embodiment uses the interface refraction, different from the first to sixth embodiments in which the face-up type LED element 1 uses the interface reflection. In order to have the interface refraction, the glass member 11h has a refractive index of n=1.9, which is greater than sapphire n=1.7. Thereby, the seventh embodiment can obtain light extraction efficiency greater than sapphire with the uneven surface formed thereon.

Further, since the flip-chip type LED element does not have the electrodes on the light extraction surface, it is advantageous in aspect of light extraction and becomes more advantageous in the case of using the high refractive index glass member 11h.

Although in the seventh embodiment the air layer defined by the concave portion 13B is used, the light extraction effect can be obtained without using the air layer. In this case, the glass member 11h is to have the high refractive index. The concave portion 13B may be in other form such as square column, hexagonal column other than the cylindrical column.

Further, the concave portion 13B may be in circular cone or pyramid form. In this case, the behavior of light irradiated to toward the side face of the concave portion 13B becomes different from the abovementioned behavior. However, if the refractive index of the glass member 11h is higher than sapphire, ever light that will not be externally radiated from a GaN layer where the GaN layer and a sapphire substrate are both formed flat or from the interface of a GaN layer and a sapphire substrate where the same uneven surface is formed as the seventh embodiment can be externally radiated from the glass member 11h.

The concave portion 13B may be formed by dry etching etc. after the lift-off of the sapphire substrate.

Although in the first to seventh embodiments the LED element 1 is composed of GaN-based semiconductor, it may be of other semiconductor such as GaAs, AlInGaP.

Although in the first to seventh embodiments the sapphire substrate is lifted off, the substrate need not be always removed if the epi-layer has the same refractive index as the substrate. In this case, the uneven surface can be formed directly on the substrate by various methods.

Eighth Embodiment (Composition of LED Element 1)

Figure 11A:
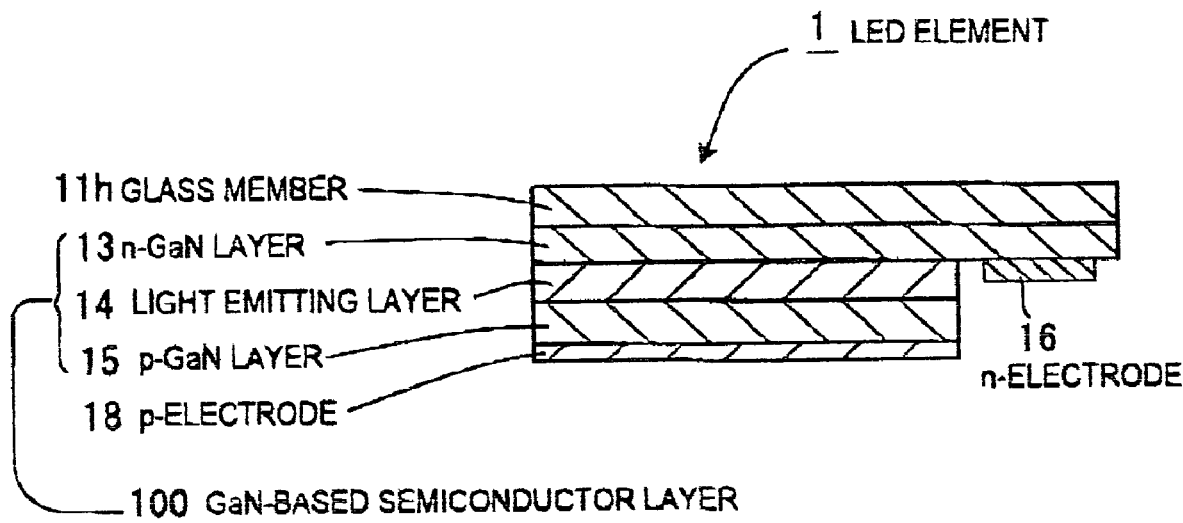
FIG. 11A is a cross sectional view showing an LED element in an eighth preferred embodiment according to the invention.
Figure 11B:
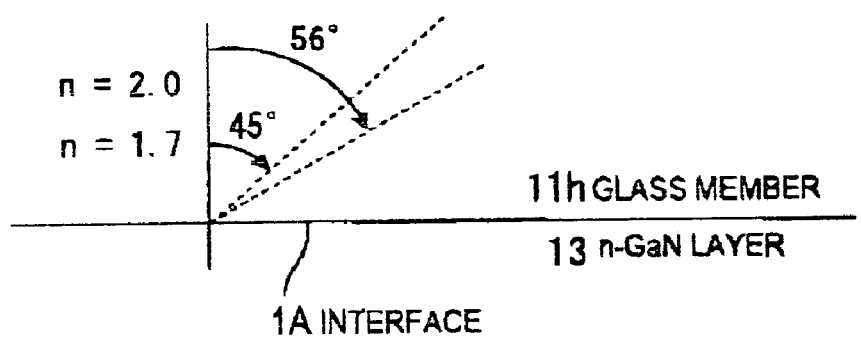
FIG. 11B is a diagram illustrating a critical angle in different materials.

FIG. 11A is a cross sectional view showing an LED element in the eighth preferred embodiment according to the invention. FIG. 11B is a diagram illustrating a critical angle in different materials.

A flip-chip type LED element 1 is, as shown in FIG. 11A, composed of: a glass member 11h which is a transparent and high refractive-index material with a higher refractive index than sapphire; an n-GaN layer 13 made of a GaN-based semiconductor compound; a light emitting layer 14 formed on the n-GaN layer 13; a p-GaN layer 15 formed on the light emitting layer 14; an n-electrode 16 formed on the n-GaN layer 13 exposed by partially removing a stack portion from the p-GaN layer 15 up to the n-GaN layer 13 by etching; and a p-electrode 18 formed on the p-GaN layer 15.

A method of forming a group III nitride-based compound semiconductor layer (e.g., the GaN-based semiconductor layer 100) is not specifically limited, and well-known metal organic chemical vapor deposition (MOCVD) method, molecular beam epitaxy (MBE) method, hydride vapor phase epitaxy (HVPE) method, sputtering method, ion plating method, cascade shower method and the like are applicable.

The light emitting element may have a homostructure, a heterostructure, or a double heterostructure. Furthermore, a quantum well structure (a single quantum well structure or a multiquantum well structure) is also applicable.

The glass member 11h is made of $Bi_2O_3$ based materials that have a refractive index of n=2.0, a thermal expansion coefficient of $7.0 \times 10^{-6}/°$ C., and a transformation point of 650° C. It is thermally bonded to the n-GaN layer 13 exposed on the GaN-based semiconductor layer 100 that is previously grown on a sapphire substrate (not shown) and is then separated from the sapphire substrate by laser beam irradiation.

FIG. 11B illustrates a difference in critical angle between the glass member and the sapphire substrate formed on the n-GaN layer 13.

When the sapphire substrate is formed on the n-GaN layer 13, a critical angel corresponds to a range indicated by an arrow in relation to n=1.7 (i.e., 45 degrees from the central axis of the LED element 1 toward an interface 1A). As a result, comparing to the glass member 11h, light externally radiated without being totally reflected is reduced. Namely, light being not externally radiated becomes intra-layer confined light and will be absorbed by the GaN-based semiconductor layer 100 or electrode material to increase an optical loss.

On the other hand, when the glass member 11h is bonded to the surface of the n-GaN layer 13, a critical angle corresponds to a range indicated by an arrow in relation to n=20 (i.e., 56 degrees from the central axis of the LED element 1 toward the interface 1A). Thus, the optical absorption inside the GaN-based semiconductor layer 100 can be reduced and the external radiation efficiency can be thereby enhanced.

(Method of Making the LED Element 1)

FIGS. 12A to 12G are cross sectional views showing a method of making the LED element 1. The method of making the LED element 1 will be explained below.

(Step of Providing the Substrate)

Figure 12A:
FIGS. 12A to 12G are cross sectional views showing a method of making the LED element in FIG. 11A, where

FIG. 12A illustrates a step of providing the substrate. First, a wafer sapphire substrate 10 is provided as an underlying substrate.

(Step of Forming a Buffer Layer)

Figure 12B:
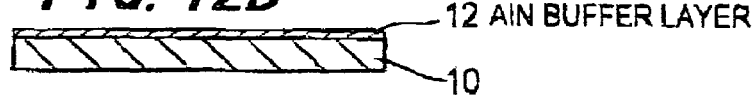

FIG. 12B illustrates a step of forming a buffer layer on the sapphire substrate. An AlN buffer layer 12 is formed on a surface of the sapphire substrate 10.

(Step of Forming the GaN-Based Semiconductor Layer 100)

Figure 12C:
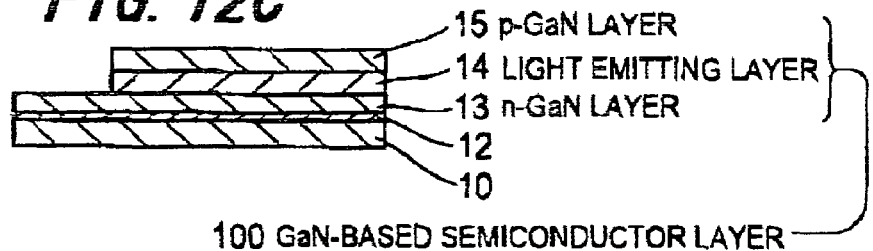

FIG. 12C illustrates a step of forming the GaN-based semiconductor layer 100. The n-GaN layer 13, the light emitting layer 14, and the p-GaN layer 15 are sequentially formed on the AlN buffer layer 12. Then, a stack portion from the p-GaN layer 15 to the n-GaN layer 13 is partially removed by etching to expose the n-GaN layer 13.

(Lift-off Step)

Figure 12D:
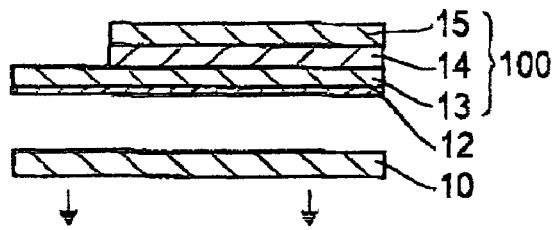

FIG. 12D illustrates a step of lifting off the sapphire substrate 10 from the GaN-based semiconductor layer. A laser beam is irradiated from the side of the sapphire substrate 10 to the entire surface of the wafer in which the GaN-based semiconductor layer 100 as shown in FIG. 12C is stacked on the sapphire substrate 10. In this case, the laser beam irradiated is provided with a wavelength to be transmitted through the sapphire substrate and not to be transmitted through the GaN-based semiconductor layer 100. Due to the irradiation of such a laser beam, the interface between the sapphire substrate 10 and the n-GaN layer 13 is locally heated. As a result, the sapphire substrate 10 as the underlying substrate is removed from the n-GaN layer 13. Further, the AlN buffer layer 12 remained on the surface of the n-GaN layer 13 is removed by acid cleaning.

(Step of Providing the Glass Member 11h)

Figure 12E:
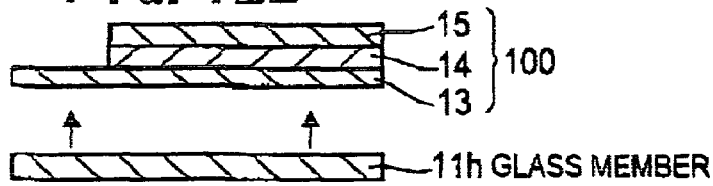

FIG. 12E illustrates a step of providing the glass member 11h to be thermally bonded to the GaN-based semiconductor layer 100 separated from the sapphire substrate. The glass member 11h with a refractive index of n=2.0 is disposed on the side of the n-GaN Layer 13 of the GaN-based semiconductor layer 100 that the sapphire substrate 10 is lifted off as shown in FIG. 12D.

(Step of Pressure-bonding the Glass Member 11h)

Figure 12F:
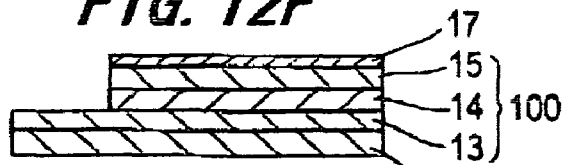

FIG. 12F illustrates a step of pressure-bonding the glass member 11h to the n-GaN layer 13 while thermally melting the glass member 11h. The glass member 11h is pressure-bonded to the n-GaN layer 13 by hot-pressing.

(Step of Forming Electrodes)

Figure 12G:
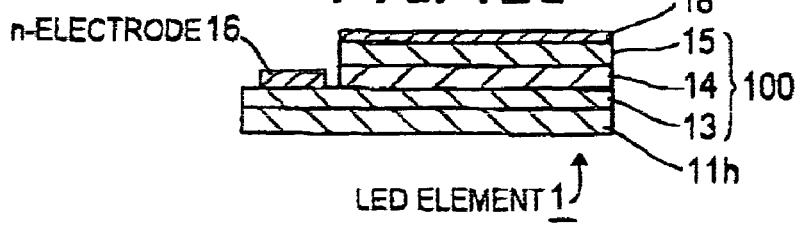

FIG. 12G illustrates a step of forming electrodes. The n-electrode 16 is as a first electrode formed on the n-GaN layer 13 exposed by etching, and the p-electrode 18 is as a second layer formed on the p-GaN layer 15. After forming the electrodes, the resulting wafer is cut by a dicer into the individual LED elements 1, and an insulation film (not shown) is formed on a surface of the LED element 1 except for the electrodes in this case, the wafer may be cut by another manner other than the dicer, for example, scribing is also applicable.

In fabricating an LED lamp by using the LED element 1 thus formed, the LED element 1 is mounted through an Au bump on a ceramics substrate on which a wiring pattern is formed. Then, the LED element 1 is sealed with a seal resin to be integrated into a package.

(Operation of the LED Element 1)

When the wiring pattern of the LED lamp is connected to a power supply (not shown) and a forward voltage is applied through the wiring pattern to the n-electrode 16 and the p-electrode 18, a carrier recombination of a hole and an electron is generated in the light emitting layer 14 to emit a light.

Of blue light emitted, a light component radiated from the light emitting layer 14 toward the glass member 11h enters into the seal resin through the glass member 11h, and it is externally radiated from the seal resin.

A light component radiated from the light emitting layer 14 toward the p-GaN layer 15 is reflected by the p-electrode 18 and then forwarded to the glass member 11h. Then, a light component falling within the critical angle of the glass member 11h is externally radiated from the LED element 1 since it is transmitted through the glass member 11h.

On the other hand, a light component reaching the glass member 11h can be externally radiated at a high efficiency. In detail, although the glass member 11h is illustrated in FIGS. 11A and 11B to be nearly equal in thickness as compared to each of the GaN layer for the sake of explanation, the glass member 11h exactly is around 100 microns in thickness and the GaN layer 13, the light emission layer 14 and the p-GaN layer 15 are around several microns in thickness. Therefore, a light component confined in GaN is significantly attenuated due to the optical absorption in the semiconductor layers and electrodes.

In contrast, the light component reaching the glass member 11h is only subjected to a negligible optical absorption in the glass member 11h. Further, since the critical angle defined between the seal resin (n=1.5) and the glass member 11h is about 50 degrees, even a light component being not externally radiated from the top surface can be externally radiated from the side face of the glass member 11h. As is the case with other interface reflection, light can be externally radiated within twice interface reflections. Thus, since the glass member 11h has a sufficient thickness (about 100 μm), a high probability for light reaching the glass member 11h can be obtained that is twice subjected to the interface reflection in the glass member 11h.

Advantages of the Eighth Embodiment

In the eighth embodiment, the following advantages can be obtained.

(1) The sapphire substrate 10 is lifted off from the n-GaN layer 13 of the LED element 1, and the glass member 11h with a higher refractive index than the sapphire substrate 10 is bonded to the n-GaN layer 13. Hence, the intra-layer confined light held inside the GaN layer can be reduced to increase blue light radiated externally. As a result, the light extraction efficiency can be enhanced.

When the sapphire substrate 10 is used, the critical angle θc based on the ratio in refractive index between the sapphire substrate 10 and the n-GaN layer 13 is 1.7 (sapphire)/2.4 (GaN): θc=45 degrees. In contrast, when the glass member 11h with a refractive index of n=2.0 is used, θc becomes 56 degrees and, thereby, the solid angle of angular aperture increases by 52%. As a result, blue light to be transmitted through the glass member 11h increases by 50% or more. Thus, the external radiation can be promoted without confining blue light inside the layer with the high optical absorption coefficient.

(2) The transparent glass member 11h is bonded to the n-GaN layer 13 from which the sapphire substrate 10 is previously lifted oft by laser beam. Thus, the LED element 1 can be easily fabricated according to an emission wavelength or desired light extraction efficiency.

(3) The Glass material, which is transparent material and can be thermally transformed, is pressure-bonded by hot-pressing. Thus, since it has an excellent adhesiveness to the n-GaN layer 13, the bonding process can be easily performed. Further, since it is nearly equal in thermal expansion coefficient to the n-GaN layer 13, the generation of crack or warpage can be prevented after the bonding.

Ninth Embodiment (Composition of LED Element 1)

Figure 13:
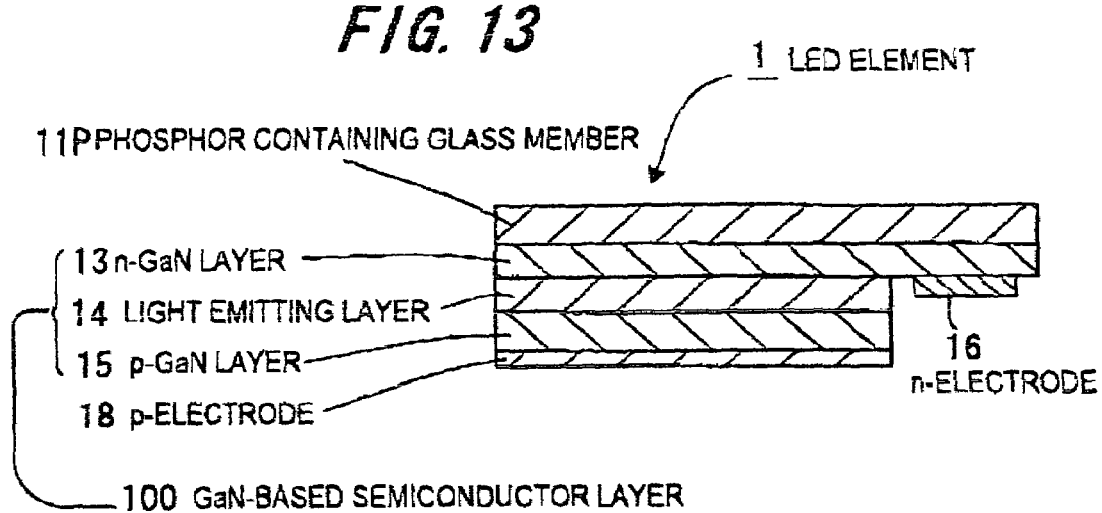
FIG. 13 is a cross sectional view showing an LED element in a ninth preferred embodiment according to the invention.

FIG. 13 is a cross sectional view showing an LED element in the ninth preferred embodiment according to the invention.

The flip-chip type LED element 1 of the ninth embodiment is different from the eighth embodiment in that a phosphor containing glass member 11P is provided in place of the glass member 11h.

The phosphor containing glass member 11P includes a phosphor particle such as YAG;Ce that is excited by blue light and radiates yellowish light. The phosphor can be a phosphor complex.

Advantages of the Ninth Embodiment

In the ninth embodiment, since the phosphor containing glass member 11P is used in which the phosphor is contained in the glass member 11h with a high refractive index, the amount of light to be irradiated to the phosphor, i.e., to be wavelength-converted can be increased as compared to the case that the phosphor is provided outside the glass member 11h.

Further, the wavelength-converted light (yellowish light) is subjected to an intra-GaN layer absorption or electrode absorption significantly smaller than blue light being not wavelength-converted. Therefore, the light extraction efficiency can be enhanced. The wavelength conversion type LED element 1 can radiate white light with even radiation based on the good excitation of the phosphor

Tenth Embodiment (Composition of LED Element 1)

Figure 14:
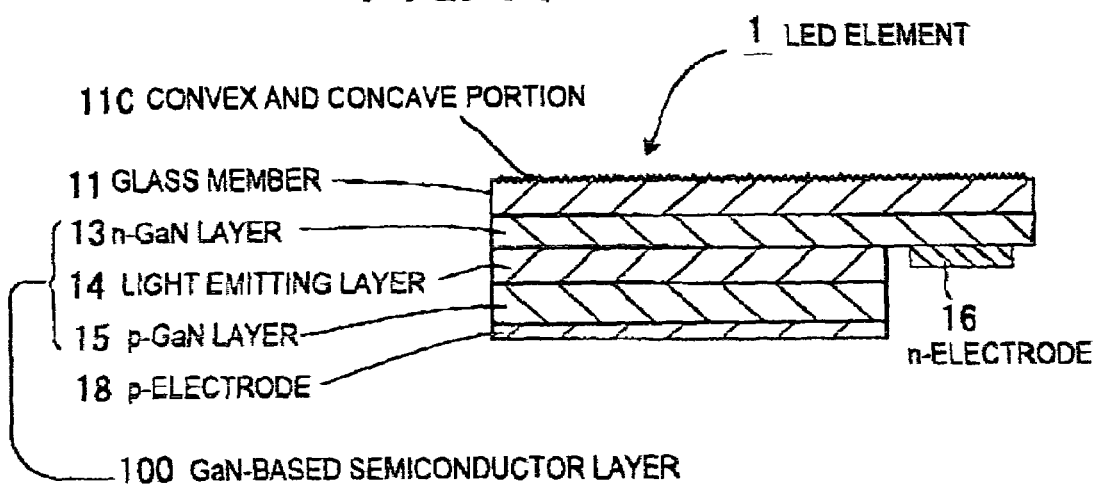
FIG. 14 is a cross sectional view showing an LED element in a tenth preferred embodiment according to the invention.

FIG. 14 is a cross sectional view showing an LED element in the tenth preferred embodiment according to the invention.

The flip-chip type LED element 1 of the tenth embodiment is different from the eighth embodiment in that the glass member 11h is provided with microscopic convex and concave portions 11C on the light extraction surface.

The convex and concave portions 11C is formed by transferring to the glass member 11h a convex and concave pattern provided on a mold for hot-pressing the glass member 11h to the n-GaN layer 13. Alternatively, the convex and concave portions 11C may be formed by other method than the transferring. For example, the glass member 11h is previously provided with the convex and concave portions and then bonded to the n-GaN layer 13 by hot-pressing.

Advantages of the Tenth Embodiment

In the tenth embodiment, since the glass member 11h is provided with microscopic convex and concave portions 11C on the light extraction surface, the surface area can be increased. Thus, the light extraction efficiency at the light extraction surface of the glass member 11h can be enhanced.

Eleventh Embodiment (Composition of LED Element 1)

Figure 15A:
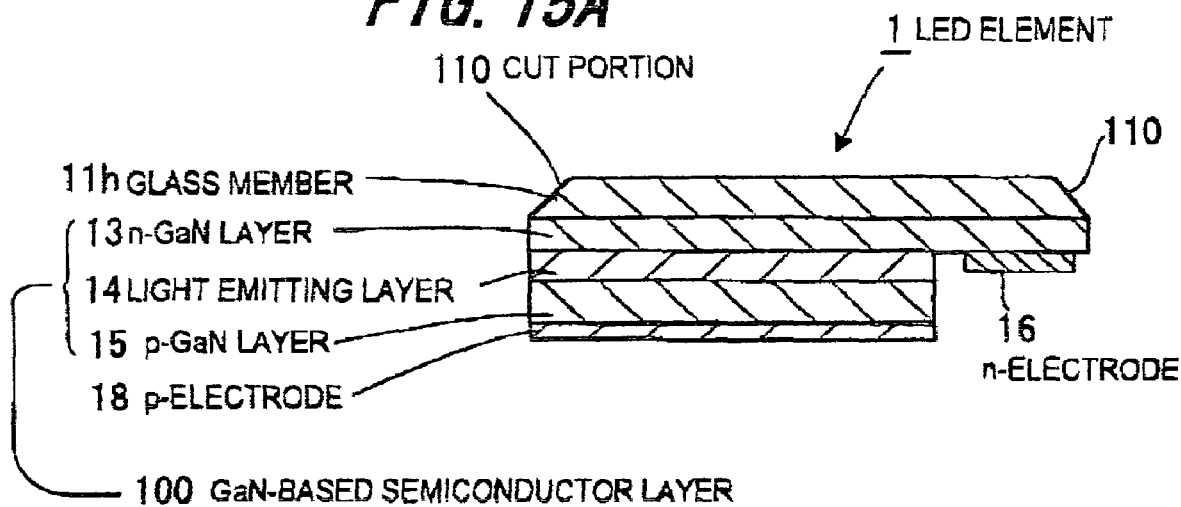
FIG. 15A is a cross sectional view showing an LED element in an eleventh preferred embodiment according to the invention.
Figure 15B:
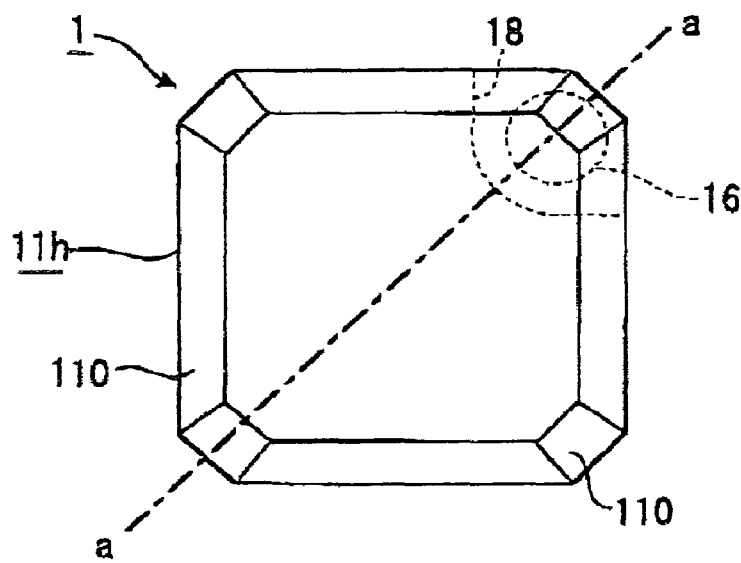
FIG. 15B is a top view showing the LED element in FIG. 15A.
Figure 15C:
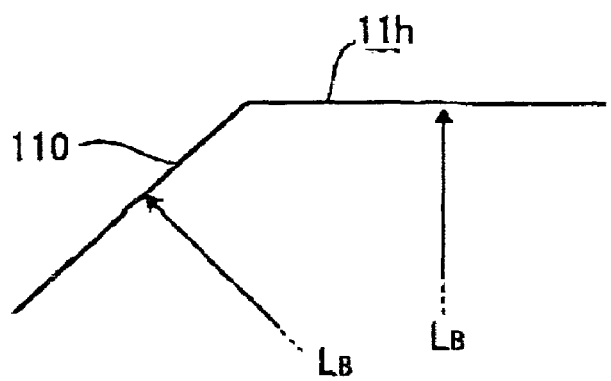
FIG. 15C is a diagram illustrating incident light to enter into a cut portion 110 in FIG. 15A.

FIG. 15A is a cross sectional view showing an LED element in the eleventh preferred embodiment according to the invention. FIG. 15B is a top view showing the LED element in FIG. 15A. FIG. 15C is a diagram illustrating incident light to enter into a cut portion 110 in FIG. 15A.

The flip-chip type LED element 1 of the eleventh embodiment is different from the eighth embodiment in that the glass member 11h is provided with a 45 degrees cut portion 110 at the corner so as to enhance the light extraction efficiency of blue light.

The cut portion 110 is formed by cutting the corner of the glass member 11h after the dicing of the LED element 1. Alternatively, when the LED element 1 is diced, a V-notch may be formed by using a dicer etc. Then, a slope (=cut portion) is formed by cutting the bottom center of the V-notch. The cut portion 110 is not limited to the 45 degrees flat slope, and may be in a cut form other than 45 degrees or in a convex form.

In the LED element 1, as shown in FIG. 15B, the light emitting layer 14 corresponding to a region of the p-electrode 18 emits blue light, which is externally radiated though the glass member 11h.

FIG. 15C illustrates the transmission in the glass member 11h of blue light LB emitted from the light emitting layer 14. Although, of blue light LB emitted from the light emitting layer 14, a light component radiated vertically upward can be perpendicularly irradiated at the interface of the glass member 11h, a light component radiated 45 degrees upward can be also perpendicularly irradiated at the cut portion 110 since the cut portion 110 is 45 degrees sloped. Thus, an optical loss due to the interface reflection can be prevented.

Advantages of the Eleventh Embodiment

In the eleventh embodiment, since the glass member 11h is provided with a 45 degrees cut portion 110 at the corner, blue light entered into the glass member 11h can be efficiently extracted and therefore the light extraction efficiency can be enhanced.

Further, when the LED element 1 is sealed with a hard material, the generation of a crack can be prevented since the corner of the glass member 11h is not removed.

Twelfth Embodiment (Composition of LED Element 1)

Figure 16:
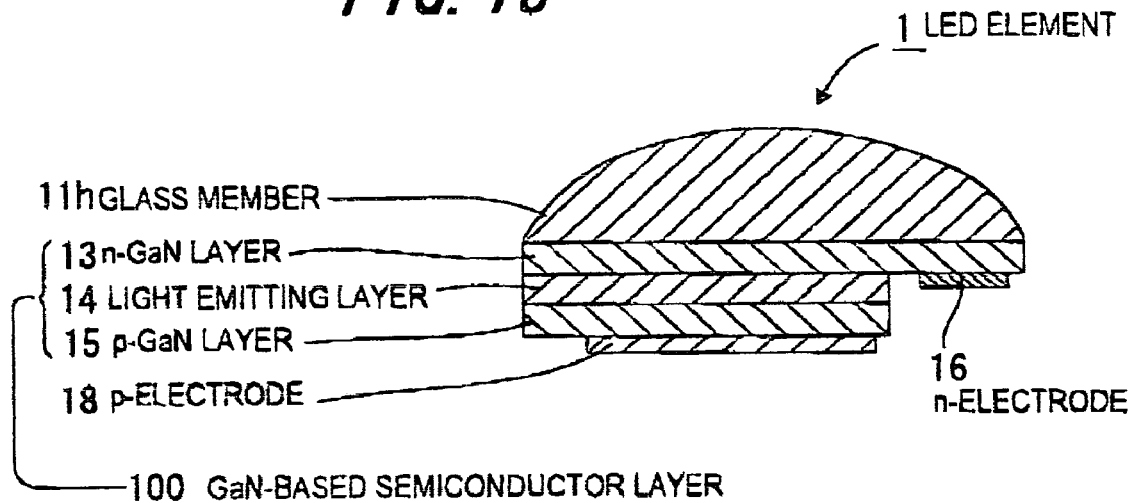
FIG. 16 is a cross sectional view showing an LED element in a twelfth preferred embodiment according to the intention.

FIG. 16 is a cross sectional view showing an LED element in the twelfth preferred embodiment according to the invention.

The flip-chip type LED element 1 of the twelfth embodiment is different from the eleventh embodiment in that the p-electrode 18 of the eleventh embodiment (See FIG. 15A) is disposed at the bottom center, and the glass member 11h is provided with a curved-surface optical form at the top so as to allow blue light to be irradiated perpendicularly

Advantages of the Twelfth Embodiment

In the twelfth embodiment, in addition to the advantages of the eleventh embodiments the distribution of blue light emitted from the light emitting layer 14 can be suitably controlled by the disposition of the p-electrode 18 and the form of the glass member 11h. However, in order to obtain the lens effect based on refraction, the glass member 11h needs to have a refractive index that is significantly different from the seal material of the LED element 1. Namely, it is desired that the glass member 11h has a refractive index of n=1.7 or more.

Although in the twelfth embodiment the glass member 11h with the optical form is bonded to the n-GaN layer 13, a substrate may be bonded thereto which has a refractive index equal to the light emitting layer 14, such as $TiO_2$, SiC and GaN. This allows light propagated inside the GaN layer to reach the side face without being affected by a layer with a high optical absorption coefficient such as the light emitting layer 14. Therefore, the external radiation efficiency can be enhanced.

Especially, the substrate with a thickness of ⅕ or more of the LED element 1 is sufficient to allow the external radiation of the light propagated inside the GaN layer in a direction of about 90 degrees to the central axis of the LED element 1.

Since the LED element 1 is of flip-chip type, the top face being lifted off of the sapphire substrate can be provided with the substrate to enhance the light extraction efficiency without having limitations in electrical disposition or in lattice match for epitaxial growth.

Thirteenth Embodiment (Composition of LED Element 1)

Figure 17:
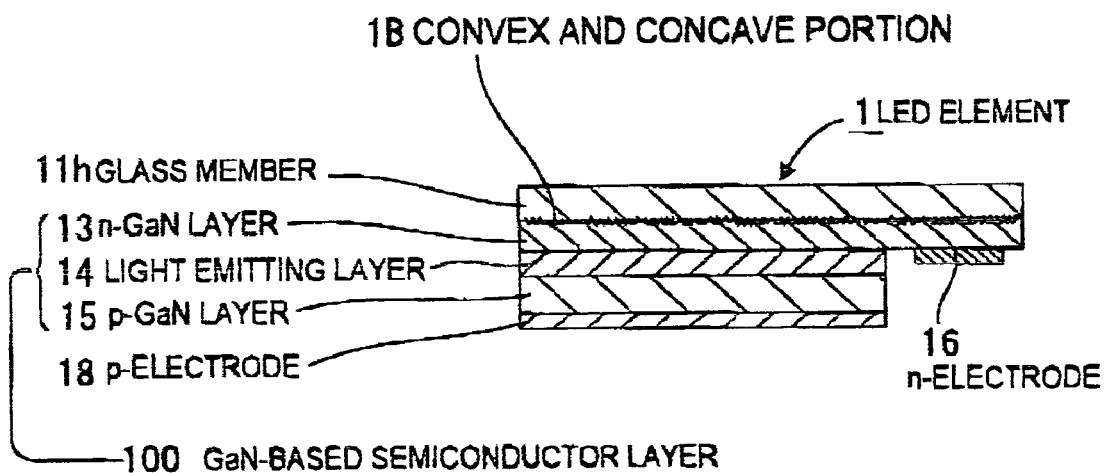
FIG. 17 is a cross sectional view showing an LED element in a thirteenth preferred embodiment according to the invention.

FIG. 17 is a cross sectional view showing an LED element in the thirteenth preferred embodiment according to the invention.

The flip-chip type LED element 1 of the thirteenth embodiment is different from the eighth embodiment in that a microscopic convex and concave portion 1B is provided between the glass member 11h and the n-GaN layer 13.

The convex and concave portion 1B is formed by roughening the n-GaN layer 13 being lifted off of the sapphire substrate. The glass member 11h is bonded onto the convex and concave portion 1B by hot-pressing Advantages of the Thirteenth Embodiment In the thirteenth embodiment, due to the hot-pressing to allow the reduction in viscosity of the glass member 11h, the glass member 11h can be formed corresponding to the form of GaN epi-layer provided with the microscopic convex and concave portion 1B on the surface.

Although in the eighth embodiment light irradiated toward the interface at an incident angle of more than 56 degrees (See FIG. 11B) is totally reflected and fails to be entered into the glass member 11h, the thirteenth embodiment allows light, such as the intra-layer confined light inside the n-GaN layer 13, irradiated toward the interface at an incident angle of more than 56 degrees, i.e., the critical angle, to be entered into the glass member 11h. Thus, the amount of light to be entered into the glass members 11h can be increased. Therefore, the external radiation efficiency can be enhanced.

Fourteenth Embodiment (Composition of LED Element 1)

Figure 18A:
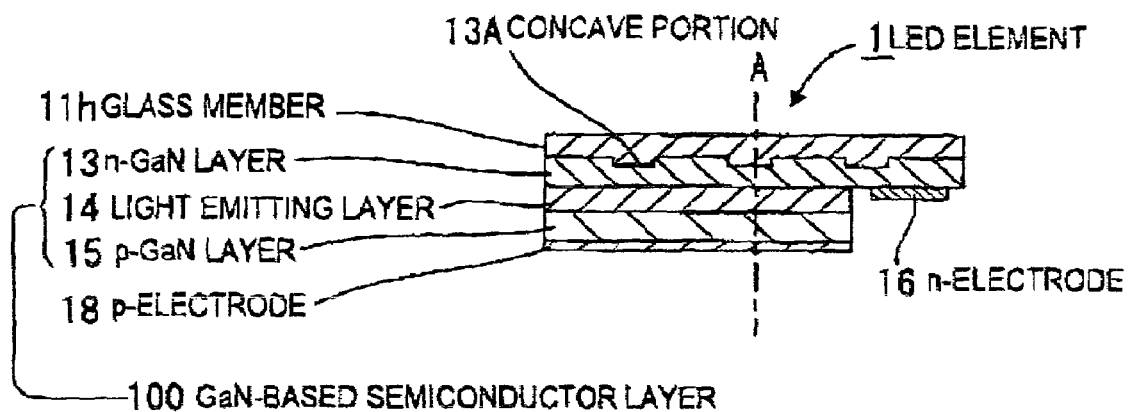
FIG. 18A is a cross sectional view showing an LED element in a fourteenth preferred embodiment according to the invention.
Figure 18B:
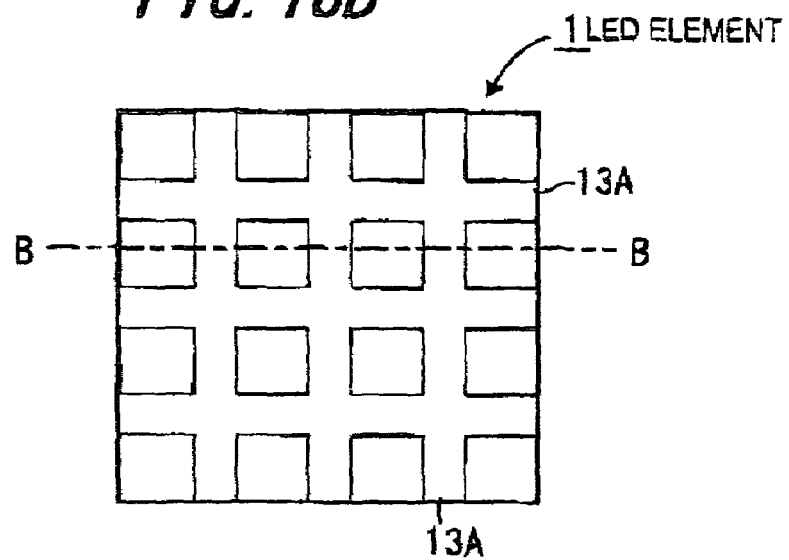
FIG. 18B is a top view showing a concave portion in FIG. 18A.
Figure 18C:
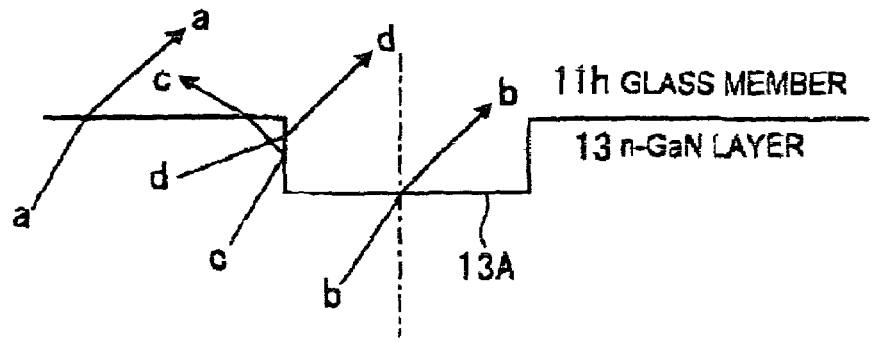
FIG. 18C is a diagram illustrating the function of the concave portion in FIG. 18A.

FIG. 18A is a cross sectional view showing an LED element in the fourteenth preferred embodiment according to the invention. FIG. 18B is a too view showing a concave portion 13A in FIG. 18A. FIG. 18C is a diagram illustrating the function of the concave portion 13A in FIG. 18A.

The flip-chip type LED element 1 of the fourteenth embodiment is different from the eighth embodiment in that the concave portion 13A is formed on the n-GaN layer 113. The concave portion 13A is nearly in a columnar form, and it has a side face nearly parallel to the central axis A as shown in FIG. 18A.

Advantages of the Fourteenth Embodiment

In the fourteenth embodiment, due to the concave portion 13A formed on the n-GaN layer 13, an uneven surface is formed between the glass member 11h and the n-GaN layer 13. This allows the intra-layer confined light inside the n-GaN layer 13 to be more entered into the glass member 11h to enhance the external radiation efficiency of the emitted blue light.

If the interface of the glass member 11h and the n-GaN layer 13 is formed a roughened face in place of a flat face without due consideration, light that will be entered from the n-GaN layer 13 into the glass member 11h in case of the flat face may not be entered into the glass member 11h due to a change in angle at the interface of the glass member 11h and n-GaN layer 13.

However, in the fourteen embodiment, light to be irradiated toward the (flat) interface within the critical angle and to be entered into the glass member 11h from the n-GaN layer 13 as shown in FIG. 11B can be equally entered into the glass member 11h as shown by lights a, b and c in FIG. 18C.

Moreover, in the fourteenth embodiment, even light not to be entered into the glass member 11h (i.e., to be totally reflected) due to the refractive index difference between the glass member 11 and the n-GaN layer 13 when the interface is flat as shown in FIG. 11B can be entered into the glass member 11h as shown by light d in FIG. 18C.

Meanwhile, light c in FIG. 18C can be entered into the glass member 11h when the critical angle is 45 degrees or more or 50 degrees or more in two-dimension as shown in FIG. 18C. If the critical angle is 45 degrees or more, it can be entered into the glass member 11h within twice of interface irradiation. If the critical angle is 50 degrees or more, the light extraction efficiency can be enhanced since the Fresnel reflection lowers.

Although it depends on the column form in three-dimension, in case of the square column in FIG. 18A, light can be entered into the glass member 11h within three times of interface irradiation if the critical angle is 55 degree or more or 60 degrees or more. By using the glass member 11h with a high refractive index, the conditions can be satisfied or nearly satisfied.

Although in this embodiment the concave portion 13A is a continuous groove reaching the side formed on the n-GaN layer 13, it may be a dotted groove formed on the n-GaN layer 13. However, in order to bond the glass member 11h to the n-GaN layer 13 without the remaining air bubbles, it is preferred that the continuous groove is formed Further, as shown in FIG. 15A, the glass member 11h may be provided with the cut portion at the corner. The glass member 11h may contain a phosphor.

Fifteenth Embodiment (Composition of LED Element 1)

Figure 19:
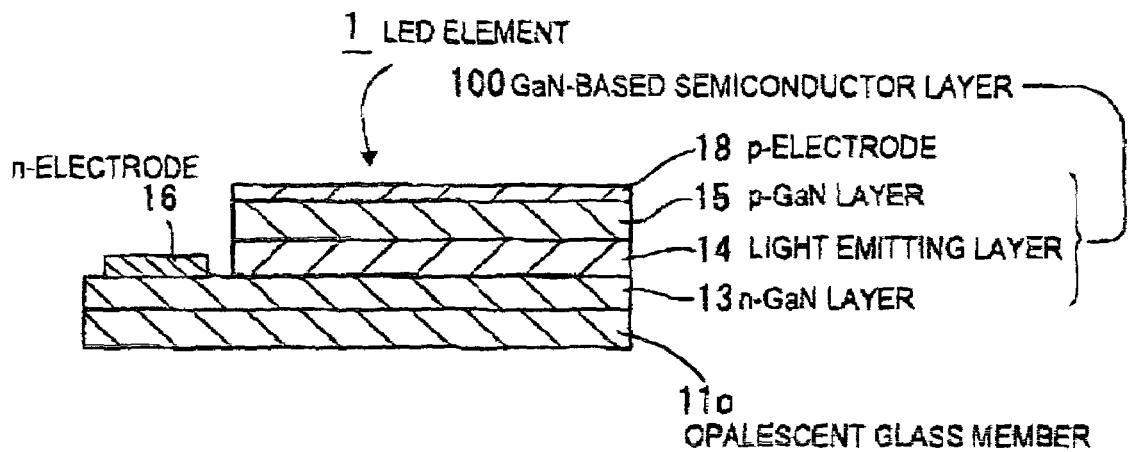
FIG. 19 is a cross sectional view showing an LED element in a fifteenth preferred embodiment according to the invention.

FIG. 19 is a cross sectional view showing an LED element in the fifteenth preferred embodiment according to the invention. Hereinafter, like components are indicated by the same numerals as used in the eighth embodiment.

The LED element 1 of the fifteenth embodiment is different from the eighth embodiment in that an opalescent glass member 11o with a refractive index of n=2.0 is provided in place of the glass member 11h of the eighth embodiment, and the LED element 1 is of face-up type.

Advantages of the Fifteenth Embodiment

In the fifteenth embodiment, since the intra-layer confined light propagated inside the n-GaN layer 13 is dispersed by the opalescent glass member 11o, the light extraction efficiency can be enhanced.

Further, there is no light absorption caused by a member to mount the LED element 1. Meanwhile, an Ag paste or organic adhesive deteriorates due to light or heat generated from the LED element 1 and causes an increase in light absorption. In this embodiment, the problem can be avoided. Thus, the face-up type is more advantageous than the flip-chip type as the case may be.

Although in the eighth to fifteenth embodiments the LED element 1 is composed of GaN-based semiconductor, it may be of other semiconductor such as GaAs, AlInGaP.

Although in the eighth to fifteenth embodiments the sapphire substrate is lifted off, the substrate need not be always removed if the semiconductor layer has the same refractive index as the substrate. In this case, the uneven surface can be formed directly on the substrate by various methods.

Although the glass member 11h is made of $Bi_2O_3$ based material with a refractive index of n=2.0, it may be of other materials such as $SiO_2$—$Nb_2O_5$ system and $SiO_2$—$B_2O_3$ system. If the glass member 11h is of a material with a refractive index higher than the seal material of the LED element 1 or the substrate for the growth of semiconductor layer, the effect of enhanced light extraction efficiency can be obtained.

For example, when epoxy resin with a refractive index of n=1.5 is used as the seal material, the glass member 11*h* with a refractive index of n=1.6 or more can be bonded to GaAs or AlInGaP to obtain the above effect.

Where GaN is grown on the sapphire substrate 10 (n=1.7), a material with a refractive index higher than the sapphire substrate 10 can be bonded to the residual semiconductor layer to obtain the above effect. If a substrate has a high refractive index, a material with a refractive index higher than the substrate needs to be used. Also in case of GaAs or AlInGaP, the glass member 11*h* with a refractive index of more than n=1.7 is preferred since the effect can be further enhanced.

Further, the high-refractive index layer provided on the light extraction side may be of a material other than the glass member 11*h*. For example, it may be of resins. Also, it may be of inorganic materials to enhance the light extraction efficiency from the GaN-based semiconductor layer 100.

Sixteenth Embodiment (Composition of LED Element 1)

Figure 20:
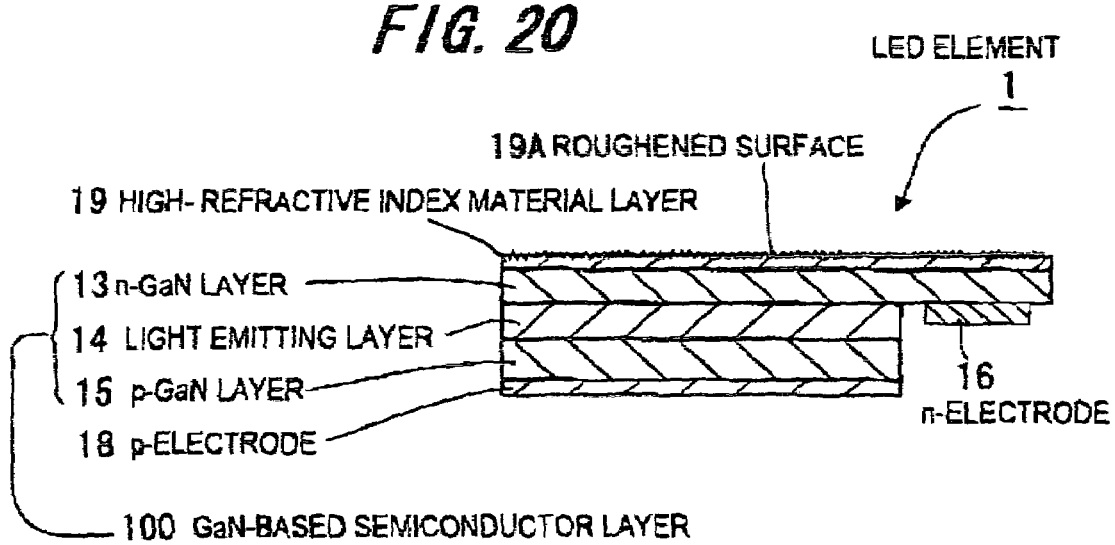
FIG. 20 is a cross sectional view showing an LED element in a sixteenth preferred embodiment according to the invention.

FIG. 20 is a cross sectional view showing an LED element in the sixteenth preferred embodiment according to the invention.

The flip-chip type LED element 1 of the sixteenth embodiment is composed such that a thin high-refractive index material layer 19 made of an inorganic material is provided on the surface of the n-GaN layer 13 exposed by lifting off the sapphire substrate as explained in the eighth embodiment.

The high-refractive index material layer 19 is formed such that a raw material of tantalum oxide ($Ta_2O_5$) is vaporized by heating and then deposited to form a μm film on the surface of the n-GaN layer 13 by electron beam deposition. $Ta_2O_5$ has a refractive index of n=2.2 and provides a critical angle θ c of 66 degrees based on the refractive index ratio to the n-GaN layer 13.

Further, a roughened portion 19A is formed by electron beam deposition on the light extraction face of the high-refractive index material layer 19.

Advantages of the Sixteenth Embodiment

In the sixteenth embodiment, since the high-refractive index material layer 19 of $Ta_2O_5$ and with n=2.2 is provided on the n-GaN layer 13, the solid angle can be increased.

Further, when $Ta_2O_5$ is recrystallized on the n-GaN layer 13 in the formation of the $Ta_2O_5$ film, the roughened portion 19A is formed. Therefore, random incident angles can be provided at the interface of the LED element 1 and the outside substance. Thereby, the light extraction efficiency can be enhanced.

The high-refractive index material layer 19 may be of a material other than $Ta_2O_5$. For example, it may be of ZnS (n=2.4), SiC (n=2.4), $HfO_2$ (n=2.0), ITO (n=2.0) or GaN. These materials may not be a conductive material if it is good in adhesiveness and optical characteristic.

Seventeenth Embodiment (Composition of LED Element 1)

Figure 21:
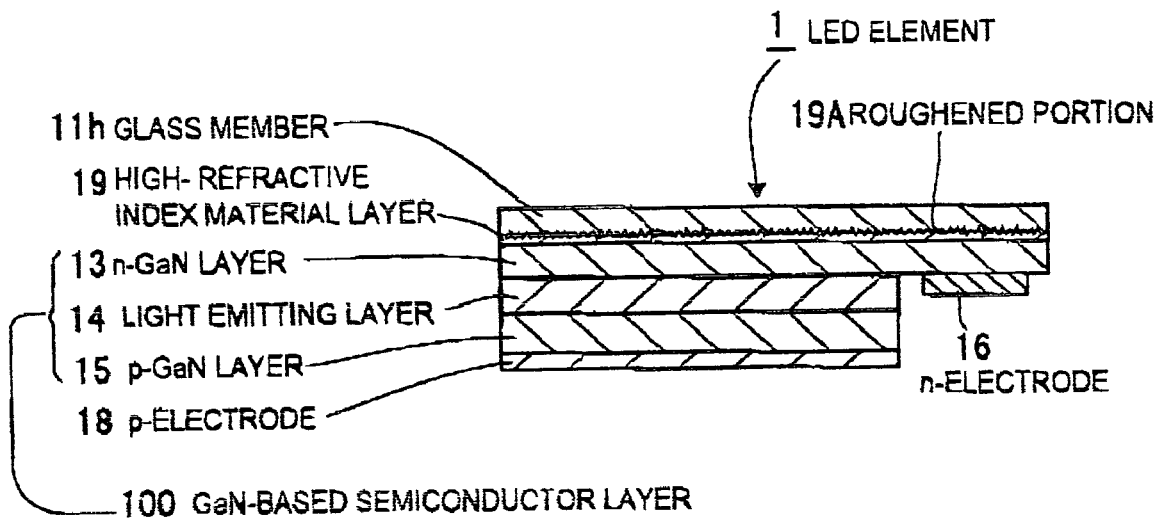
FIG. 21 is a cross sectional view showing an LED element in a seventeenth preferred embodiment according to the invention.

FIG. 21 is a cross sectional view showing an LED element in the seventeenth preferred embodiment according to the invention.

The flip-chip LED element 1 of the seventeenth embodiment is composed such that a glass member 11*h* with n=1.75 is bonded onto the high-refractive index material layer 19 as explained in the sixteenth embodiment.

Advantages of the Seventeenth Embodiment

In the seventeenth embodiment, since light entered from the n-GaN layer 13 into the high-refractive index material layer 19 is dispersed at the interface of the high-refractive index material layer 19 and the glass member 11*h*, the external radiation efficiency can be further enhanced.

This is because, in addition to the roughened portion 19A of the sixteenth embodiment, the glass member 11*h* contributes to increase the critical angle θ c in radiating light from the high-refractive index material layer 19. Thereby, the light extraction efficiency from the n-GaN layer 13 into the glass member 11 can be enhanced.

Eighteenth Embodiment (Composition of LED Element 1)

Figure 22:
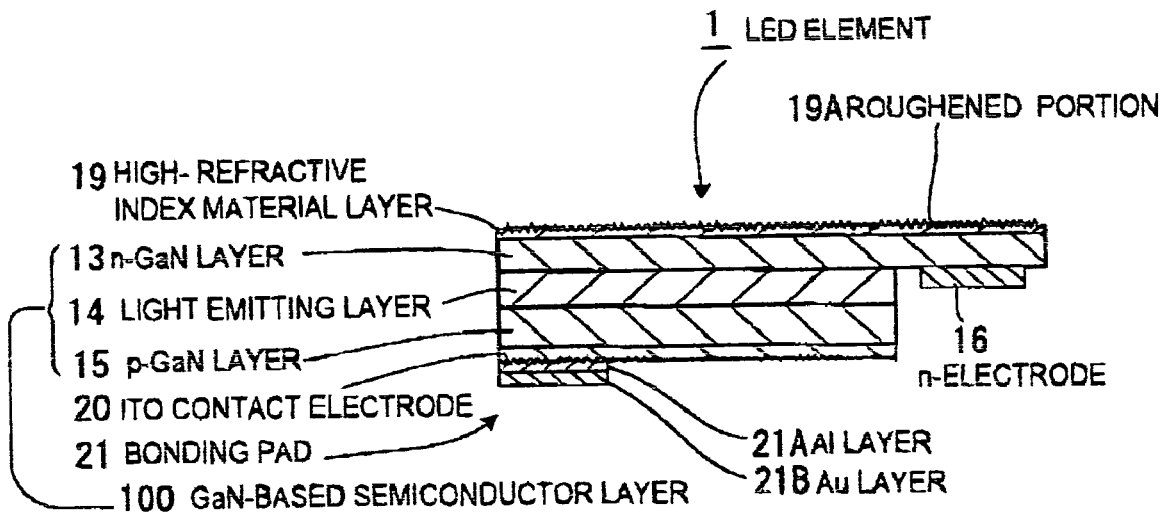
FIG. 22 is a cross sectional view showing an LED element in an eighteenth preferred embodiment according to the invention.

FIG. 22 is a cross sectional view showing an LED element in the eighteenth preferred embodiment according to the invention.

The flip-chip LED element 1 of the eighteenth embodiment is composed such that an ITO contact electrode 20 with a thermal expansion coefficient of $7.7\times10^{-6}/°$ C. and a bonding pad 21 composed of an Al layer 21A and an Au layer 21B are provided in place of the p-electrode 18 of the sixteenth embodiment.

Advantages of the Eighteenth Embodiment

In the eighteenth embodiment, in addition to the advantages of the sixteenth embodiment, since the ITO contact electrode 20 has a thermal expansion coefficient nearly equal to the GaN-based semiconductor layer 100, the adhesiveness of the p-electrode can be enhanced. Thereby, the LED element 1 can have such an increased reliability that the p-electrode is not separated due to heat in sealing the LED element 1 or heat generated in emitting light.

Further, unevenness in light emission can be reduced due to the current diffusion performance of ITO.

Nineteenth Embodiment (Composition of LED Element 1)

Figure 23A:
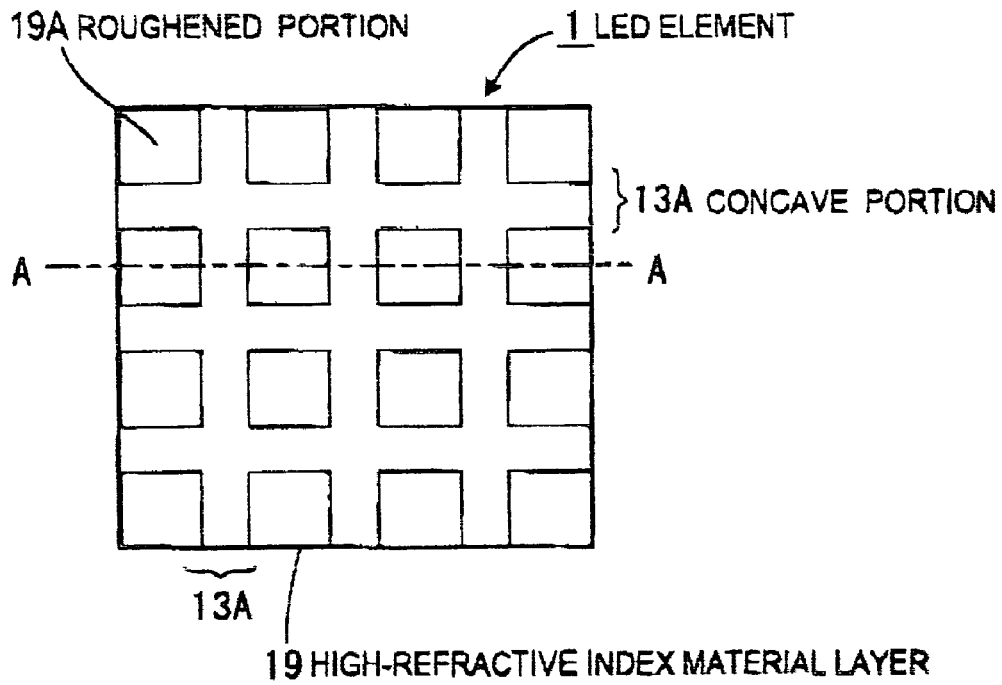
FIG. 23A is a top view showing an LED element in a nineteenth preferred embodiment according to the invention.
Figure 23B:
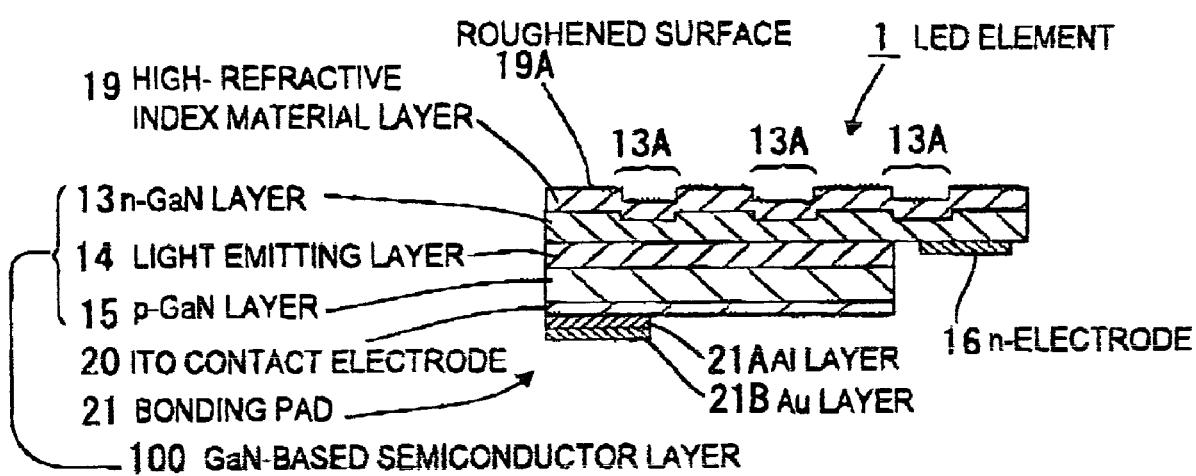
FIG. 23B is a cross sectional view cut along a line A-A in FIG. 23A.

FIG. 23A is a top view showing an LED element in the nineteenth preferred embodiment according to the invention. FIG. 23B is a cross sectional view cut along a line A-A in FIG. 23A.

The flip-chip type LED element 1 of the nineteenth embodiment is composed such that the n-GaN layer 13 of the eighteenth embodiment is provided with a concave portion 13A in groove form and with a given width and given depth as shown in FIG. 23A, and the high-refractive index material layer 19 is provided thereon as shown in FIG. 23B.

Advantages of the Nineteenth Embodiment

In the nineteenth embodiment, in addition to the advantages of the eighteenth embodiment, since the concave portion 13A in groove form is provided in lattice pattern, the light extraction surface can be increased. Further, since the light extraction surface is composed of a flat face and a vertical face, the light extraction efficiency can be enhanced Further, since the high-refractive index material layer 19 with the roughed portion 19A formed thereon is provided on the n-GaN layer 13, the intra-layer confined light inside the n-GaN layer 13 can be externally radiated from the grooveshaped concave portion 13A before reaching the side face. In this case, the critical angle can be increased due to the high-refractive index material layer 19. Therefore, the LED element 1 can have an enhanced external radiation efficiency.

Twentieth Embodiment (Composition of LED Element 1)

Figure 24:
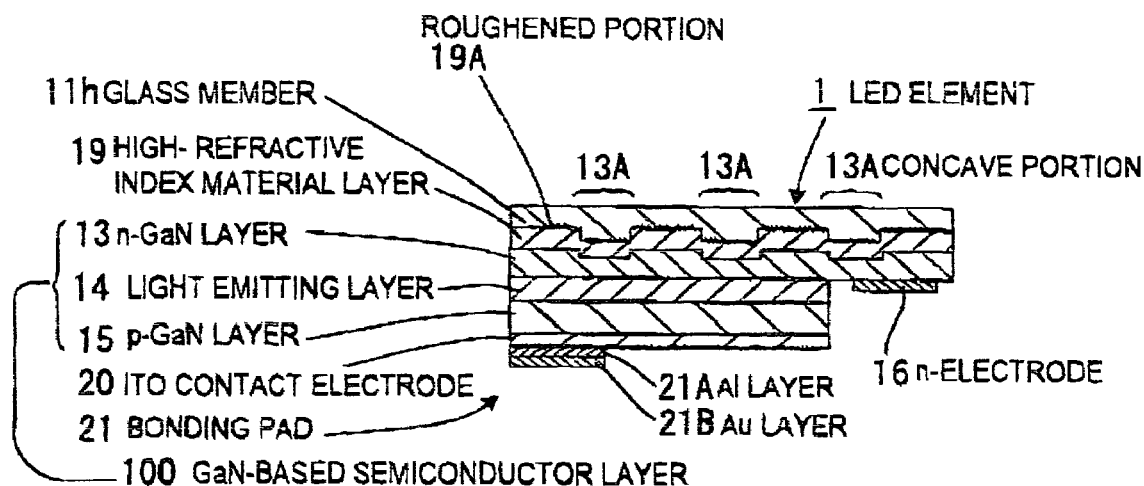
FIG. 24 is a cross sectional view showing an LED element in a twentieth preferred embodiment according to the invention.

FIG. 24 is a cross sectional view showing an LED element in the twentieth preferred embodiment according to the invention.

The flip-chip type LED element 1 of the twentieth embodiment is composed such that a glass member 11h with n=1.75 is bonded onto the high-refractive index material layer 19 of the nineteenth embodiment.

Advantages of the Twentieth Embodiment

In the twentieth embodiment, in addition to the advantages of the nineteenth embodiment, since light being entered from the n-GaN layer 13 into the high-refractive index material layer 19 is in a random incident angle irradiated toward the interface of the high-refractive index material layer 19 and the glass member 11h and, thus, the critical angel is increased, the external radiation efficiency can be further increased.

Twenty-first Embodiment (Composition of LED Element 1)

Figure 25:
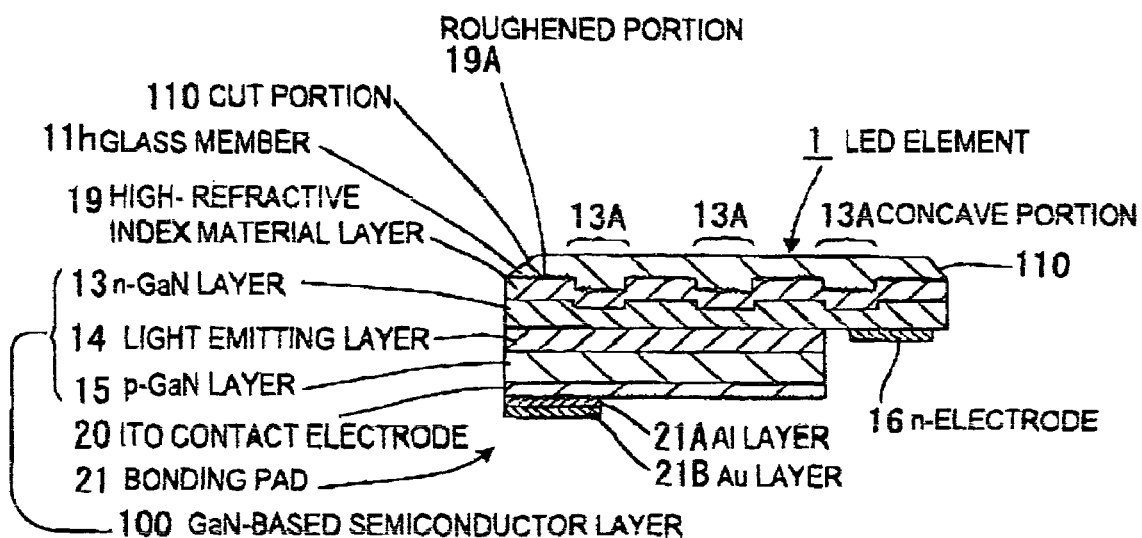
FIG. 25 is a cross sectional view showing an LED element in a twenty-first preferred embodiment according to the invention.

FIG. 25 is a cross sectional view showing an LED element in a twenty-first preferred embodiment according to the invention.

The flip-chip type LED element 1 of the twenty-first embodiment is composed such that the glass member 11h of the twentieth embodiment is provided with a cut portion 110 sloped 45 degrees at the corner.

Advantages of the Twenty-First Embodiment

In the twenty-first embodiment, in addition to the advantages of the twentieth embodiment, light laterally propagated inside the glass member 11h can be externally radiated from the cut portion 110. Thus, the light extraction efficiency can be further enhanced.

Twenty-second Embodiment (Composition of LED Element 1)

Figure 26A:
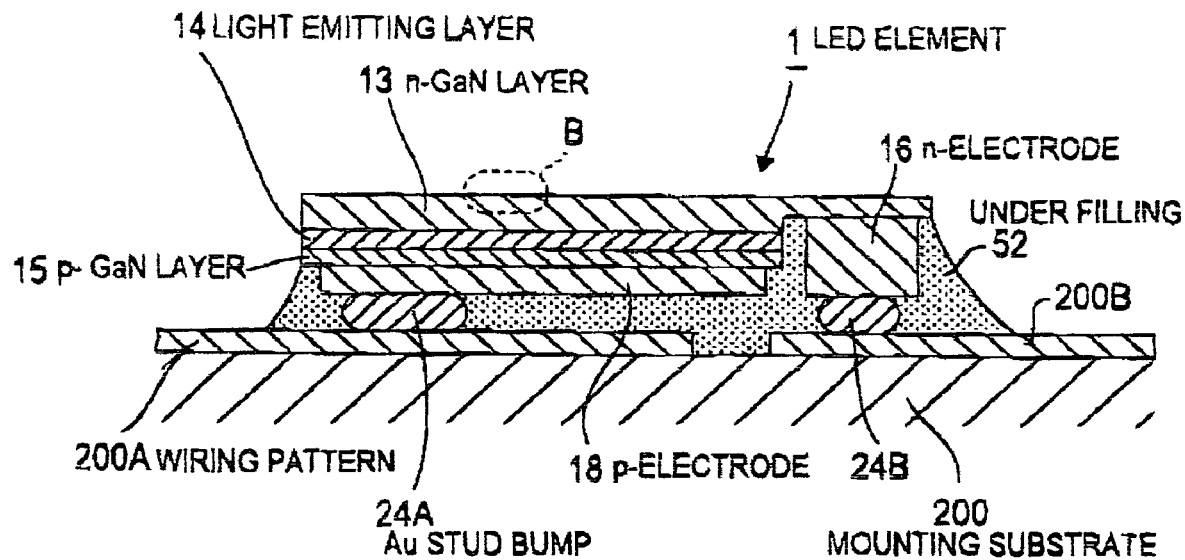
FIG. 26A is a cross sectional view showing an LED element in a twenty-second preferred embodiment according to the invention.
Figure 26B:
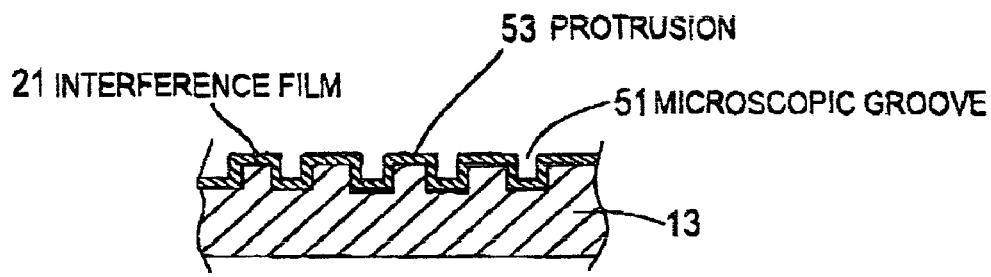
FIG. 26B is an enlarged cross sectional view showing part B in FIG. 26A.
Figure 26C:
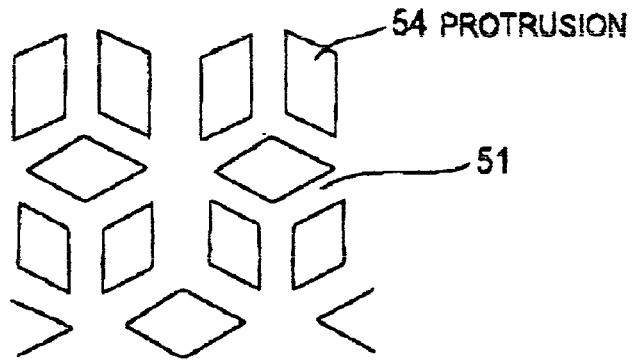
FIG. 26C is an enlarged top view part B in FIG. 26A

FIG. 26A is a cross sectional view showing an LED element in the twenty-second preferred embodiment according to the invention. FIG. 26B is an enlarged cross sectional view showing part B in FIG. 26A. FIG. 26C is an enlarged top view part B in FIG. 26A.

In the twenty-second embodiment, the LED element 1 is composed such that, as shown in FIG. 26B, a microscopic groove 51 is formed on the n-GaN layer 13 from which the sapphire substrate is lifted off, an interference film 21 is formed on the microscopic groove 51, and an under filling 52 is filled between a mounting substrate 200 and the LED element 1.

The sapphire substrate is lifted off by laser beam irradiation after the n-GaN layer 13, the light emitting layer 14 and the p-GaN layer 15 are epitaxially grown on the sapphire substrate. Then, the microscopic groove 51 is formed by laser etching on the exposed surface of the n-GaN layer 13.

For example, as shown in FIG. 26B, the microscopic groove 51 is 2 μm in width and 1 μm in depth to form a square protrusion 53. Alternatively, as shown in FIG. 26C, the microscopic groove 51 is patterned to form a rhombic or rectangular protrusion 54.

The interference film 21 is made of SiN, and it also serves as a passivation film. The interference film 21 is formed by CVD (chemical vapor deposition). The interference film 21 has a thickness of 800 Å and a refractive index of n=1.9. When a seal material is provided surrounding the LED element 1, the interference film 21 functions as an intermediate refractive index material between the GaN layer (n=2.4) and the seal material (n=1.5). Especially, the light extraction efficiency can be enhanced when the interference film 21 has a refractive index of $n_1 = \sqrt{n_0 * n_2}$, where the GaN layer has a refractive index $n_0$ and the seal material has a refractive index of $n_2$. Therefore, the interference film 21 of SiN is selected to have a refractive index approximated to $n_1 = \sqrt{2.4*1.5} \approx 1.90$.

Advantages of the Twenty-second Embodiment

In the twenty-second embodiment, the numerous protrusions are formed on the exposed surface of the n-GaN layer 13 by the microscopic groove 51, and the interference film 21 with the intermediate refractive index is formed thereon. Therefore, light that cannot be extracted with the flat surface of the n-GaN layer 13 can be extracted therethrough. As a result, the light extraction efficiency can be enhanced. Further, due to the protrusion pattern in a random form as shown in FIG. 26C, the light extraction efficiency can be optimized.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A method of making a light emitting element, comprising:
    providing an underlying substrate;
    forming a semiconductor layer on the underlying substrate;
    lifting off the underlying substrate from the semiconductor layer;
    forming an uneven portion on the lifted-off surface of the semiconductor layer; and
    bonding a transparent material onto an entire surface of the uneven portion of the semiconductor layer,
    wherein the transparent material is selected to have a refractive index ratio to the semiconductor layer greater than the underlying substrate so as to increase light to be transmitted through the transparent material, and
    wherein the light emitting element comprises a flip-chip type light emitting element.

2. The method according to claim 1, wherein the transparent material comprises a glass material and is bonded onto the entire surface of the uneven portion of the semiconductor layer by a hot-pressing that allows a reduction of a viscosity of the glass material.

3. The method according to claim 2, wherein the underlying substrate comprises a sapphire substrate.

4. The method according to claim 3, wherein the transparent material has a refractive index of more than 1.7.

5. The method according to claim 3, wherein a ratio in refractive index between the transparent material and the semiconductor layer defines a critical angle of more than 45 degrees.

* * * * *